US008230376B2

(12) United States Patent
Kumagai et al.

(10) Patent No.: US 8,230,376 B2
(45) Date of Patent: Jul. 24, 2012

(54) DESIGNING SUPPLY WIRINGS IN SEMICONDUCTOR INTEGRATED CIRCUIT BY DETECTING POWER SUPPLY WIRING OF SPECIFIC WIRING LAYER IN PROJECTION AREA

(75) Inventors: Kenji Kumagai, Tokyo (JP); Jun Suda, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 172 days.

(21) Appl. No.: 12/642,044

(22) Filed: Dec. 18, 2009

(65) Prior Publication Data
US 2010/0169851 A1 Jul. 1, 2010

(30) Foreign Application Priority Data
Dec. 25, 2008 (JP) ................................ 2008-330112

(51) Int. Cl.
*G06F 17/50* (2006.01)
(52) U.S. Cl. ............ 716/118; 716/120; 716/127; 326/80
(58) Field of Classification Search .................. 716/118, 716/120, 127; 326/80
See application file for complete search history.

(56) References Cited

U.S. PATENT DOCUMENTS

| 6,421,816 | B1 * | 7/2002 | Ishikura | 257/355 |
| 6,609,242 | B1 * | 8/2003 | Slade | 716/127 |
| 7,272,810 | B2 * | 9/2007 | Orita | 326/80 |
| 2007/0061769 | A1 * | 3/2007 | Kumagai | 716/13 |
| 2009/0113370 | A1 * | 4/2009 | Yoshinaga | 716/11 |

FOREIGN PATENT DOCUMENTS

JP 10-199987 7/1998

* cited by examiner

*Primary Examiner* — Naum Levin
(74) *Attorney, Agent, or Firm* — Staas & Halsey LLP

(57) ABSTRACT

A design support method for causing a computer using layout data for providing a layout in which macro cells are arranged and in which power supply wirings are formed at certain intervals in each wiring layer to execute, the method including: extracting a set of adjacent macro cells from the layout data; specifying a region located between macro cells that constitute the set of adjacent macro cells extracted in the extracting step from among row regions included in the layout represented by the layout data; detecting a power supply wiring of a specific wiring layer in a projection area located above the region specified in the specifying step, the specific wiring layer being higher than a bottom layer of the layout represented by the layout data; and outputting a region where no power supply wiring of the specific wiring layer is detected in the detecting step.

6 Claims, 24 Drawing Sheets

FIG. 2 power supply wiring connection information

| wiring/via | width | start coordinates | end coordinates |
|---|---|---|---|
| METAL4 | 5 | (100,70) | (100,165) |
| METAL4 | 5 | (180,70) | (180,380) |
| METAL4 | 5 | (260,70) | (260,190) |
| METAL4 | 5 | (340,70) | (340,115) |
| ⋮ | ⋮ | ⋮ | ⋮ |
| METAL5 | 5 | (70,100) | (450,100) |
| METAL5 | 5 | (70,150) | (120,150) |
| ⋮ | ⋮ | ⋮ | ⋮ |
| METAL6 | 5 | (120,70) | (120,380) |
| METAL6 | 5 | (200,70) | (200,380) |
| ⋮ | ⋮ | ⋮ | ⋮ |
| VIA45 | 0 | (100,100) | |
| VIA45 | 0 | (100,150) | |
| ⋮ | ⋮ | ⋮ | |
| VIA56 | 0 | (120,100) | |
| VIA56 | 0 | (120,150) | |
| ⋮ | ⋮ | ⋮ | |

201 macro placement information

| macro name | coordinates |
|---|---|
| RAM_MACRO1 | (80,320) |
| RAM_MACRO2 | (170,320) |
| OOO_MACRO1 | (130,120) |
| ⋮ | ⋮ |

202 the range of wiring layers used for each macro 203

| macro name | layer range | MacroX[μm] | MacroY[μm] |
|---|---|---|---|
| RAM_MACRO1 | 1~3 | 50 | 40 |
| RAM_MACRO2 | 1~3 | 45 | 40 |
| OOO_MACRO1 | 1~5 | 80 | 50 |
| ⋮ | ⋮ | ⋮ | ⋮ |

200

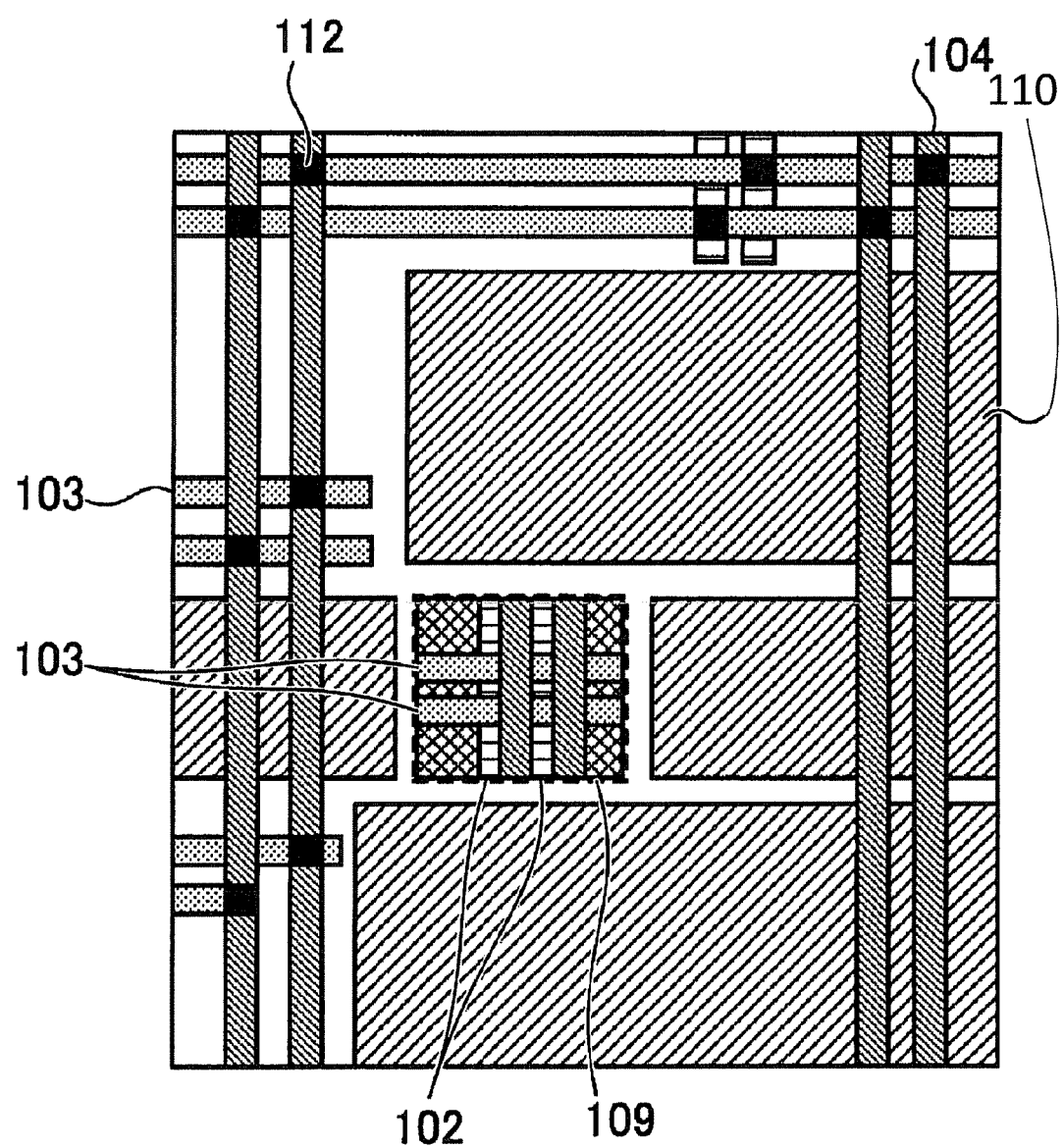

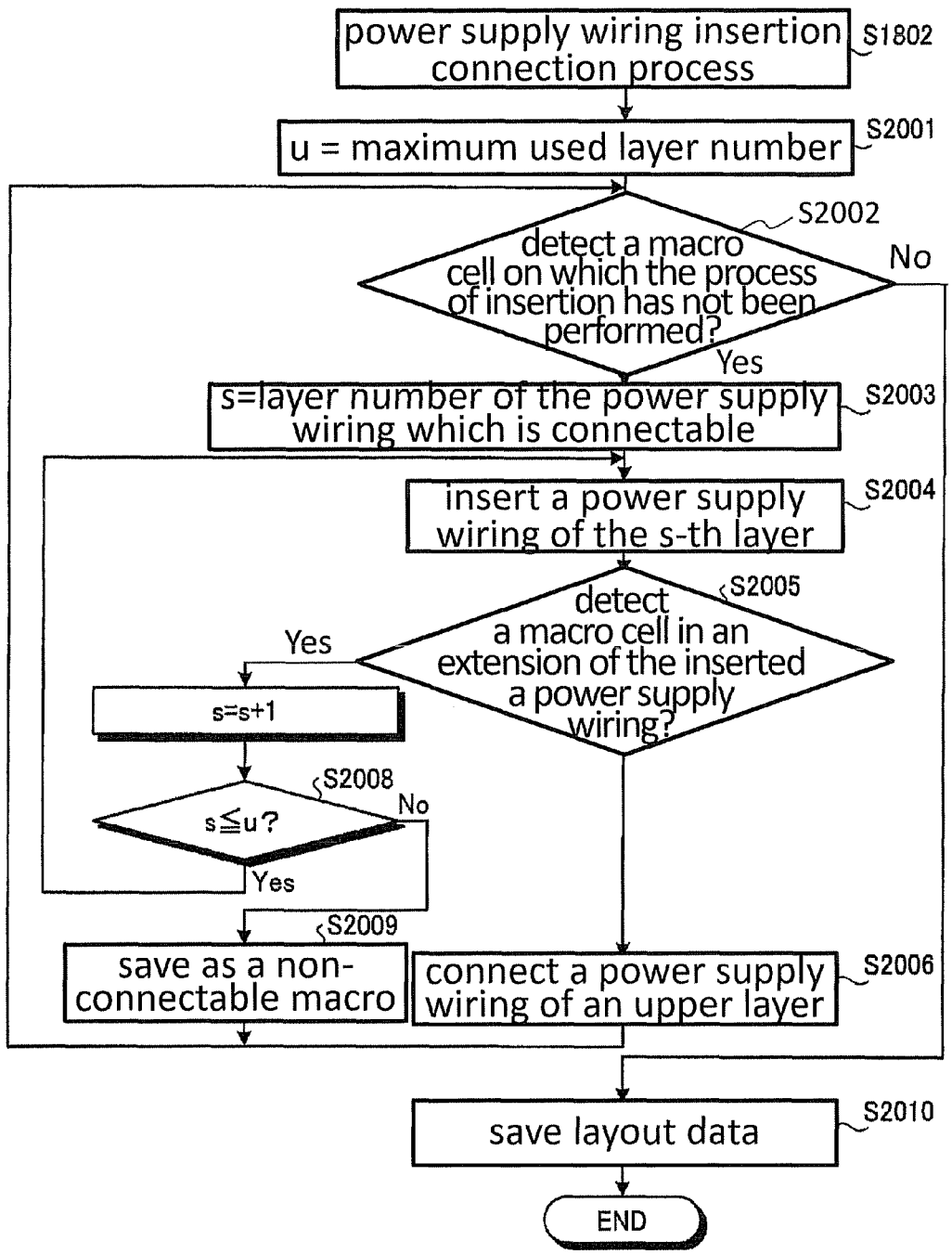

DESIGNING SUPPLY WIRINGS IN SEMICONDUCTOR INTEGRATED CIRCUIT BY DETECTING POWER SUPPLY WIRING OF SPECIFIC WIRING LAYER IN PROJECTION AREA

CROSS REFERENCE TO RELATED APPLICATION

This application is based upon and claims the benefit of priority from the prior Japanese Patent Application NO. 2008-330112 filed on Dec. 25, 2008, the entire contents of which are incorporated herein by reference.

FIELD

The embodiments discussed herein are related to a design support method and a design support apparatus for designing power supply wirings in a semiconductor integrated circuit.

BACKGROUND

In general layout design of semiconductor integrated circuits, after the positions of macro cells to be placed are determined, power supply wirings are automatically arranged at certain intervals in each wiring layer. In a row region or macro cell where lack of power supply wiring occurs, a power supply wiring is manually inserted and connected.

To prevent insertion error or misconnection of power supply wirings, which is caused by the manual operation, for example, Japanese Laid-open Patent Publication No. 10-199987 discloses a technique in which connectivity is checked after the formation of power supply wirings. In the technique, a power supply network analysis for simulating the current density and the amount of voltage drop is further made to search for a portion including a power supply wiring to be corrected and the wiring is corrected accordingly.

However, the technique of the related art described above in which a power supply wiring is manually inserted and connected has a problem in that designing a manual layout of power supply wirings is time-consuming.

Other problems also arise. In the process of checking connectivity after the completion of power supply wiring, it is difficult to detect a portion including voltage drop although it is possible to detect a portion where no wiring is formed. In a power supply network analysis for detecting a power drop, the extraction of resistance values and capacitance values of the power supply wirings and the calculation of power consumption require much time. Every correction of power supply wiring requires to retry the layout design, and the load on the design engineer as well as the period of layout design may be increased.

SUMMARY

According to an aspect of the embodiments, a design support method for causing a computer accessible to a storage device storing layout data for providing a layout in which macro cells are arranged and in which power supply wirings are formed at certain intervals in each wiring layer to execute, the design support method including: extracting a set of adjacent macro cells from the layout data; specifying a region located between macro cells that constitute the set of adjacent macro cells extracted in the extracting step from among row regions included in the layout represented by the layout data, the extracting step being for extracting a set of adjacent macro cells from the layout data; detecting a power supply wiring of a specific wiring layer in a projection area located above the region specified in the specifying step, the specific wiring layer being higher than a bottom layer of the layout represented by the layout data, the specifying step being for specifying a region located between macro cells that constitute the set of adjacent macro cells; and outputting a region where no power supply wiring of the specific wiring layer is detected in the detecting step, the detecting step being for detecting a power supply wiring of a specific wiring layer in a projection area located above the region specified in the specifying step.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 2 is a diagram illustrating an example of physical information about the layout data;

FIG. 17C is a diagram illustrating the macro cell 109 where a power supply wiring 104 of a layer C has been inserted;

FIG. 20 is a flowchart illustrating a power supply wiring insertion and connection process procedure.

DESCRIPTION OF EMBODIMENTS

First and second design support methods and design support apparatuses according to preferred embodiments of the present invention will be described in detail hereinafter with reference to the accompanying drawings. The present embodiments allow an easy and quick layout of power supply wirings which is suitable for a semiconductor integrated circuit. In this case, layout data for providing a layout in which macro cells are arranged and in which power supply wirings are formed at certain intervals in each wiring layer may be used to detect a row region or a macro cell where no power supply wiring is formed and thus no power is supplied. In a first method, a row region where no power supply wiring is formed and thus no power is supplied is detected, and power supply wiring is formed in the detected row region. In a second method, a macro cell where no power supply wiring is formed and thus no power is supplied is detected, and a power supply wiring is formed in the detected macro cell. The first method will be described with respect to a first embodiment, and the second method will be described with respect to a second embodiment.

Overview of First Embodiment

First, the first embodiment will be described. In the first embodiment, a row region where no power supply wiring is formed and thus no power is supplied is detected from among row regions included in a layout represented by layout data. If a power supply wiring to be connected is not located above the detected row region, no power is supplied to the detected row region. This may save time for manually searching for a row region where no power is supplied. This may also provide quick discovery of a row region where no power is supplied.

Furthermore, a power supply wiring is automatically inserted into the detected row region to which no power supply wiring is connected, thereby forming a power supply wiring in a desired portion to provide appropriate power supply.

(Layout Data)

Figure 1:
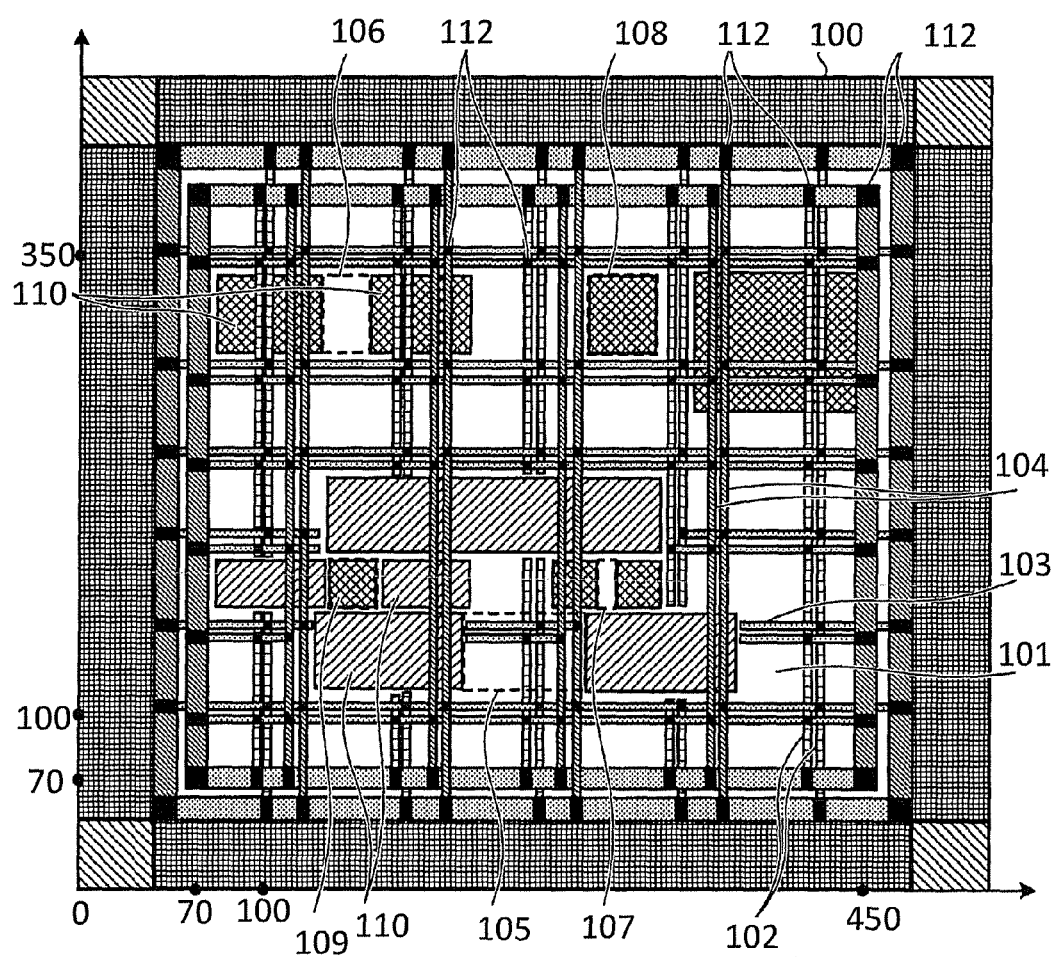
FIG. 1 is a diagram illustrating layout data for providing a layout of power supply wirings in a semiconductor integrated circuit.

FIG. 1 is a diagram illustrating layout data 100 for providing a layout of power supply wirings in a semiconductor integrated circuit. The layout represented by the layout data 100 illustrated in FIG. 1 includes power supply wirings 102 of a layer A, power supply wirings 103 of a layer B, and power supply wirings 104 of a layer C. In each of the three layers, power supply wirings are arranged at certain intervals. The power supply wirings are arranged in order from bottom to top, that is, in order of the power supply wirings 102 of the layer A, the power supply wirings 103 of the layer B, and the power supply wirings 104 of the layer C.

Row regions 101 are standard-cell placement regions. Standard cells placed in the row regions 101 are connected to the power supply wirings of the bottom layer. The power supply wirings of an upper layer (power supply wirings of a specific layer), which are connected to the power supply wirings of the bottom layer, are the power supply wirings 102 of the layer A.

The power supply wirings of the layers that are stacked on top of one another from bottom to top are alternately formed in such a manner that the power supply wirings of a given layer extend parallel to the X-axis direction while the power supply wirings of the overlying layer extend parallel to the Y-axis direction. For example, when the power supply wirings of the bottom layer are parallel to the X-axis direction, the power supply wirings 102 of the layer A, which is stacked on the bottom layer, are parallel to the Y-axis direction. Additionally, the power supply wirings of the bottom layer cross the power supply wirings 102 of the layer A. Vias 112 are disposed at intersections between the power supply wirings of two layers that share the same power supply. The power supply wirings of the two layers that share the same power supply are connected to each other through the vias 112. Similarly, the power supply wirings 102 of the layer A and the power supply wirings 103 of the layer B are formed and connected to each other, and the power supply wirings 103 of the layer B and the power supply wirings 104 of the layer C are formed and connected to each other.

The layout represented by the layout data 100 further includes macro cells 111 and 110. The macro cells 110 are configured such that wirings of the layers below the layer C are formed inside the macro cells 110. That is, the power supply wirings 102 of the layer A or the power supply wirings 103 of the layer B do not extend over the macro cells 110. On the other hand, the macro cells 111 are configured such that wirings of the layer below the layer A are formed inside the macro cells 111. That is, the power supply wirings 102 of the layer A extend over the macro cells 111. Macro cells 108 and 109 (defined by dotted rectangles) are configured using wirings of up to the same wiring layer as that of the macro cells 111.

The macro cells 108 and 109 are macro cells where no power supply wiring is formed. The power supply wirings 102 of the layer A do not extend over the macro cell 108 or 109. Therefore, no power supply wiring of an upper layer is connected to the power supply terminal of the macro cell 108 or 109. No power is supplied to the macro cell 108 or 109, resulting in incorrect operation of the macro cells 108 and 109.

In the second embodiment described below, the macro cells 108 and 109 (defined by dotted rectangles) are extracted from among the macro cells included in the layout represented by the layout data 100, and power supply wirings are formed in the macro cells 108 and 109.

Row regions 106 and 107 (defined by dotted rectangles) that are portions in the row regions 101 are regions to which no power supply wiring is connected. The row regions 106 and 107 are regions that are sandwiched between macro cells and over which the power supply wirings 102 of the layer A do not extend. In those regions, therefore, power supply wirings of the bottom layer are not connected to power supply wirings of the upper layer. Since no power is supplied to those regions, if standard cells are placed in those regions, the standard cells may operate incorrectly.

Accordingly, in the first embodiment, the row regions 106 and 107 (defined by dotted lines) are detected from among the row regions 101 included in the layout represented by the layout data 100, and a power supply wiring is formed.

(Physical Information).

FIG. 2 is a diagram illustrating an example of physical information about layout data. For example, physical information 200 includes power supply wiring connection information 201, macro cell placement information 202, and macro cell wiring layer information 203. The power supply wiring connection information 201 describes the metal layer number of each wiring, the wiring width, and the start coordinates (X,Y) and end coordinates (X,Y) of the wiring. In the physical information 200, the power supply wirings 102 of the layer A have metal layer number "METAL4", the power supply wirings 103 of the layer B have metal layer number "METAL5", and the power supply wirings 104 of the layer C have metal layer number "METAL6".

The physical information 200 is stored in a storage device described below, such as a read-only memory (ROM), a random access memory (RAM), a magnetic disk, or an optical disk.

Here, information about an intersection between the power supply wirings 102 of the layer A and the power supply wirings 103 of the layer B is used by way of example. One of the power supply wirings 102 of the layer A, which is assigned METAL4, is formed with a width of 5 µm so as to extend from the start coordinates (100, 70) to the end coordinates (100, 165). One of the power supply wirings 103 of the layer B, which is assigned METAL5, is formed with a width of 5 µm so as to extend from the start coordinates (70, 100) to the end coordinates (450, 100). A via, which is assigned VIA45, provides a connection between the two wirings at the position corresponding to the coordinates (100, 100).

The macro cell placement information 202 describes, for example, the placement positions of macro cells. A RAM macro cell RAM_MACRO1 is placed so that an end of the macro cell, which is near the origin, has coordinates (80, 320). The macro cell wiring layer information 203 describes the range of wiring layers that are used for each macro cell and the size of the macro cell. The macro cell RAM_MACRO1 uses wirings of metal layers 1 to 3. Therefore, power is supplied to the macro cell RAM_MACRO1 by connecting the macro cell RAM_MACRO1 to power supply wirings of layer 4.

"MacroX" denotes the size of each macro cell in the X direction. "MacroY" denotes the size of each macro cell in the Y direction. The coordinates of all ends of each macro cell is calculated using the coordinates of an end of the macro cell, which is near the origin, and the size of the macro cell.

Inside the macro cells 110, wirings of the layers below the layer C are formed. Therefore, power is supplied to the macro cells 110 by connecting the macro cells 110 to power supply wirings 104 of the layer C. Inside the macro cells 111, wirings of the layer below lower the layer A are formed. Therefore, power is supplied to the macro cells 111 by connecting the macro cells 111 to power supply wirings 102 of the layer A.

(Hardware Configuration of Design Support Apparatus)

Figure 3:
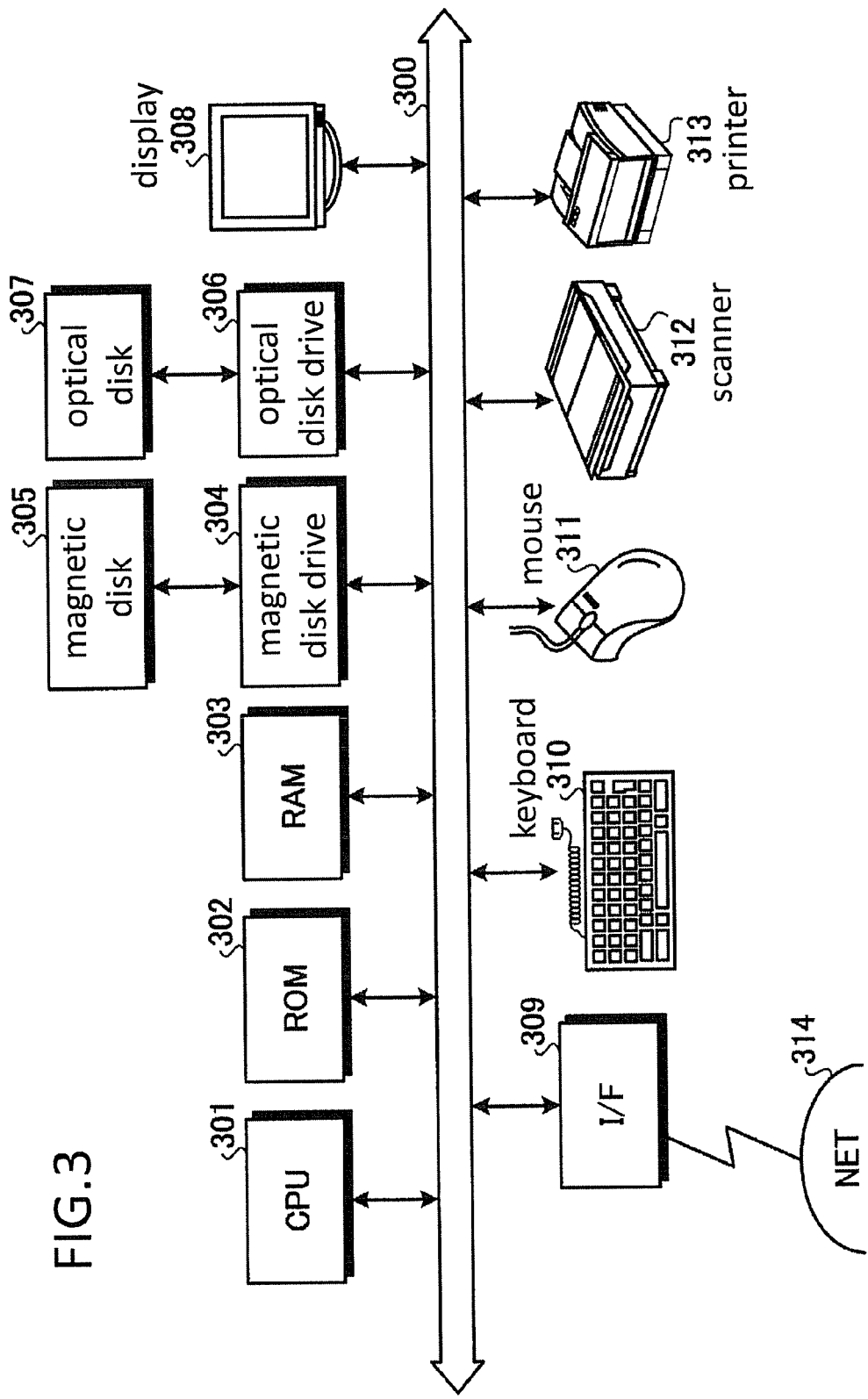
FIG. 3 is a block diagram illustrating the hardware configuration of a design support apparatus according to a first embodiment.

FIG. 3 is a block diagram illustrating the hardware configuration of a design support apparatus according to the first embodiment. In FIG. 3, the design support apparatus includes a central processing unit (CPU) 301, a ROM 302, a RAM 303, a magnetic disk drive 304, a magnetic disk 305, an optical disk drive 306, an optical disk 307, a display 308, an interface (I/F) 309, a keyboard 310, a mouse 311, a scanner 312, and a printer 313. The individual components are connected to one another via a bus 300.

The CPU 301 controls the overall operation of the design support apparatus. The ROM 302 stores a program such as a boot program. The RAM 303 is used as a work area for the CPU 301. The magnetic disk drive 304 controls read/write of data from/to the magnetic disk 305 under control of the CPU 301. The magnetic disk 305 stores data that is written under control of the magnetic disk drive 304.

The optical disk drive 306 controls read/write of data from/to the optical disk 307 under control of the CPU 301. The optical disk 307 stores data that is written under control of the optical disk drive 306, or allows a computer to read the data stored in the optical disk 307.

The display 308 displays, as well as a cursor and an icon or a toolbox, a document, an image, and data such as function information. The display 308 is implemented using, for example, a cathode ray tube (CRT), a thin-film transistor (TFT) liquid crystal display, a plasma display, or any other suitable display.

The interface (hereinafter referred to as an "I/F") 309 is connected to a network 314 such as a local area network (LAN), a wide area network (WAN), or the Internet via a communication line, and is further connected to another device via the network 314. The I/F 309 controls interface between the network 314 and the internal components, and controls the input and output of data to and from an external device. The I/F 309 may be implemented using, for example, a modem, a LAN adapter, or any other suitable device.

The keyboard 310 includes keys for entering characters, numerals, various instructions, and the like, and is used for data input. A touch panel input pad, a ten-key pad, or any other suitable device may be used. The mouse 311 is used to perform operations such as moving the cursor, selecting a range, and moving or sizing a window. Any other device serving as a pointing device and having functions similar to those of the mouse 311, such as a trackball or a joystick, may be used.

The scanner 312 optically reads an image to capture image data into the design support apparatus. The scanner 312 may have an optical character reader (OCR) function. The printer 313 prints image data or document data. The printer 313 may be implemented using, for example, a laser printer or an inkjet printer.

(Functional Configuration of Design Support Apparatus)

Figure 4:
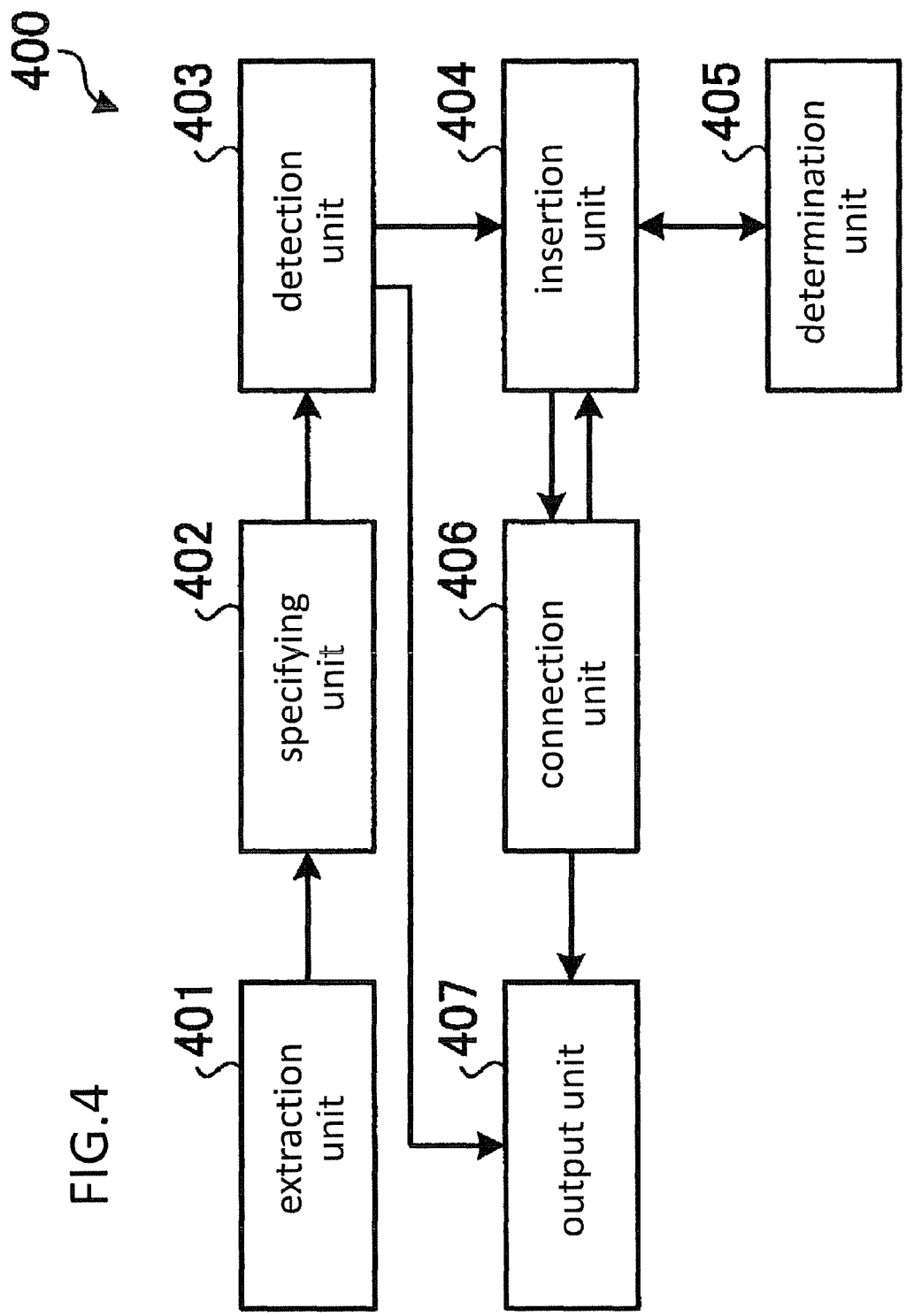
FIG. 4 is a block diagram illustrating the functional configuration of the design support apparatus according to the first embodiment.

FIG. 4 is a block diagram illustrating the functional configuration of a design support apparatus 400 according to the first embodiment. The design support apparatus 400 is configured to include an extraction unit 401, a specifying unit 402, a detection unit 403, an insertion unit 404, a determination unit 405, a connection unit 406, and an output unit 407.

Specifically, the functions of the extraction unit 401, the specifying unit 402, the detection unit 403, the insertion unit 404, the determination unit 405, the connection unit 406, and the output unit 407 are implemented by, for example, causing the CPU 301 illustrated in FIG. 3 to execute a program stored in a storage device such as the ROM 302, the RAM 303, the magnetic disk 305, or the optical disk 307 or are implemented by using the I/F 309.

The extraction unit 401 extracts a set of adjacent macro cells. Specifically, for example, the CPU 301 retrieves the coordinates of the individual macro cells from the macro cell placement information 202 in the physical information 200. Then, adjacent macro cells are extracted as a set of macro cells on the basis of the retrieved coordinates. The extracted sets of macro cells are held in a storage device such as the RAM 303, the magnetic disk 305, or the optical disk 307.

The specifying unit 402 specifies a region between macro cells that constitute a set of macro cells extracted as a by the extraction unit 401. Specifically, for example, the CPU 301 reads the extracted set of macro cells which is held in the storage device. Then, endpoints of opposing adjacent sides of the macro cells are detected. Then, a region defined by the four endpoints, which is sandwiched between the two macro cells, is specified. The specified region is a region among the row regions 101. The specified row region is held in a storage device such as the RAM 303, the magnetic disk 305, or the optical disk 307. A method for specifying a row region will be described with reference to FIG. 5A.

Figure 5A:
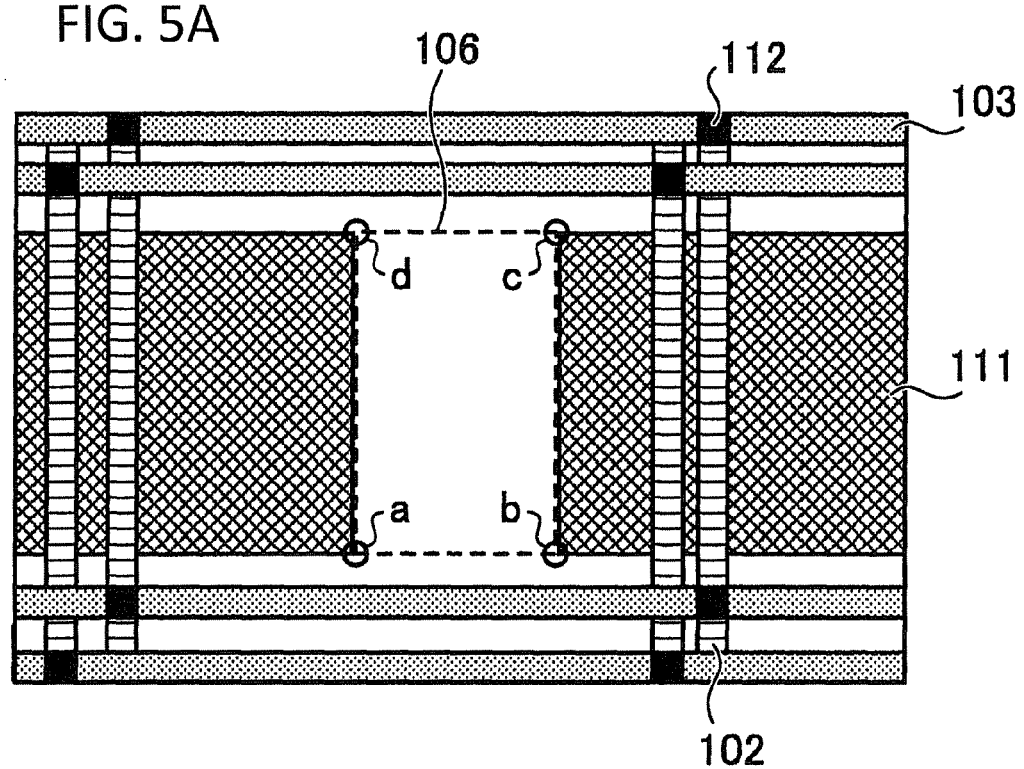
FIG. 5A is a diagram illustrating a row region 106 specified by a specifying unit 402.

FIG. 5A is a diagram illustrating the row region 106 specified by the specifying unit 402. In FIG. 5A, the power supply wirings 104 of the layer C are not illustrated for ease of understanding. Adjacent macro cells 111 are one of the sets of macro cells extracted by the extraction unit 401. The row region 106 is sandwiched between the macro cells in this set of macro cells. The specifying unit 402 determines the coordinates of endpoints a and d of a side of one of the macro cells 111 and the coordinates of endpoints b and c of a side of the other macro cell 111 to specify the row region 106.

Referring back to FIG. 4, the detection unit 403 detects a power supply wiring of a specific wiring layer higher the bottom layer in a projection area located above the region specified by the specifying unit 402. The power supply wirings of the specific wiring layer are power supply wirings connected to the power supply wirings of the bottom layer. In this example, the power supply wirings of the specific wiring layer are the power supply wirings of the layer A. Specifically, for example, the CPU 301 detects a power supply wiring 102 of the layer A, which extends over coordinates within the specified row region, from the power supply wiring connection information 201 in the physical information 200.

A row region where no power supply wiring 102 of the layer A is detected is a row region to which no power supply wiring is connected and thus no power is supplied. In the first embodiment, a row region where no power supply wiring is detected by the detection unit 403 is a region where a power supply wiring is to be inserted and connected. Information about the row region where no power supply wiring of the specific wiring layer is detected is stored in a storage device such as the RAM 303, the magnetic disk 305, or the optical disk 307. A region where no specific power supply wiring is detected will now be described with reference to FIGS. 5B, 6A, and 6B.

Figure 5B:
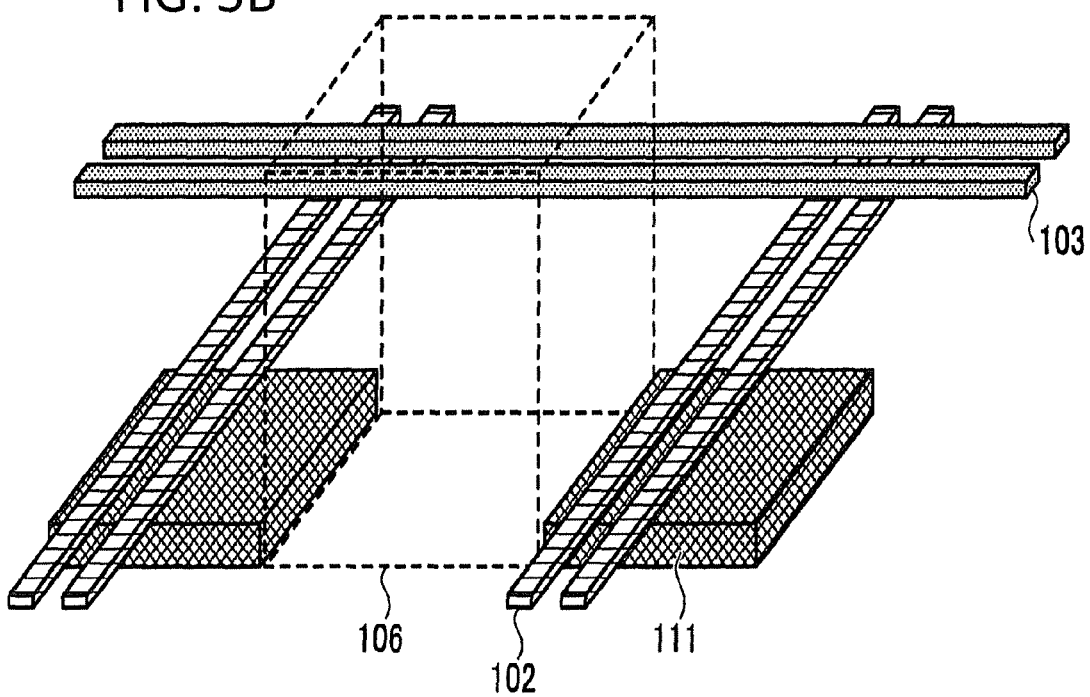
FIG. 5B is a three-dimensional view of a projection area located above the row region 106.

FIG. 5B is a three-dimensional view of a projection area located above the row region 106. In FIG. 5B, the power supply wirings 104 of the layer C or vias are not illustrated for ease of understanding. The projection area located above the row region 106 is represented by, for example, a dotted rectangular box. The detection unit 403 determines whether or not the dotted rectangular box includes a power supply wiring 102 of the layer A.

None of the power supply wirings 102 of the layer A is included in the dotted rectangular box. In other words, the row region 106 is a region having a projection area located thereabove where no power supply wiring 102 of the layer A is detected. The row region 106 is therefore a region where no power supply wiring is formed and thus no power is supplied.

Figure 6A:
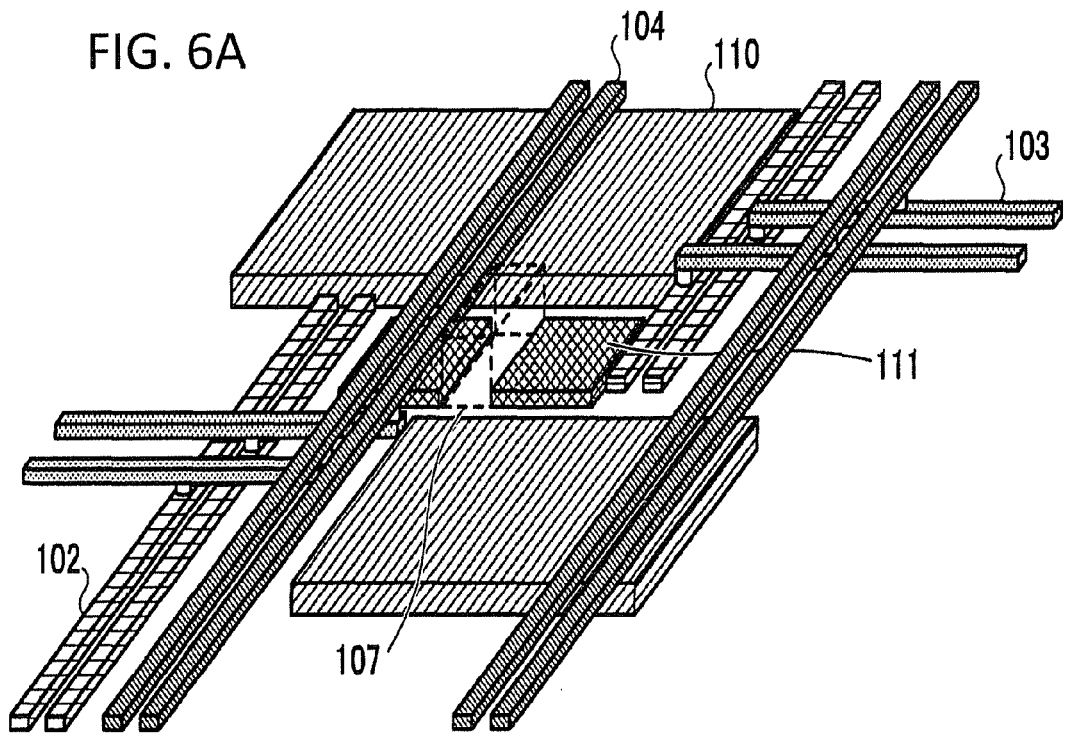
FIG. 6A is a three-dimensional view of a projection area located above a row region 107.

FIG. 6A is a three-dimensional view of a projection area located above the row region 107. For example, the row region 107 is a region sandwiched between adjacent macro cells 111. The projection area located above the row region 107 is represented by a dotted rectangular box. The detection unit 403 determines whether or not the dotted rectangular box includes a power supply wiring 102 of the layer A. Next, a region where no power supply wiring 102 of the layer A is detected will be described with reference to FIG. 6B.

Figure 6B:
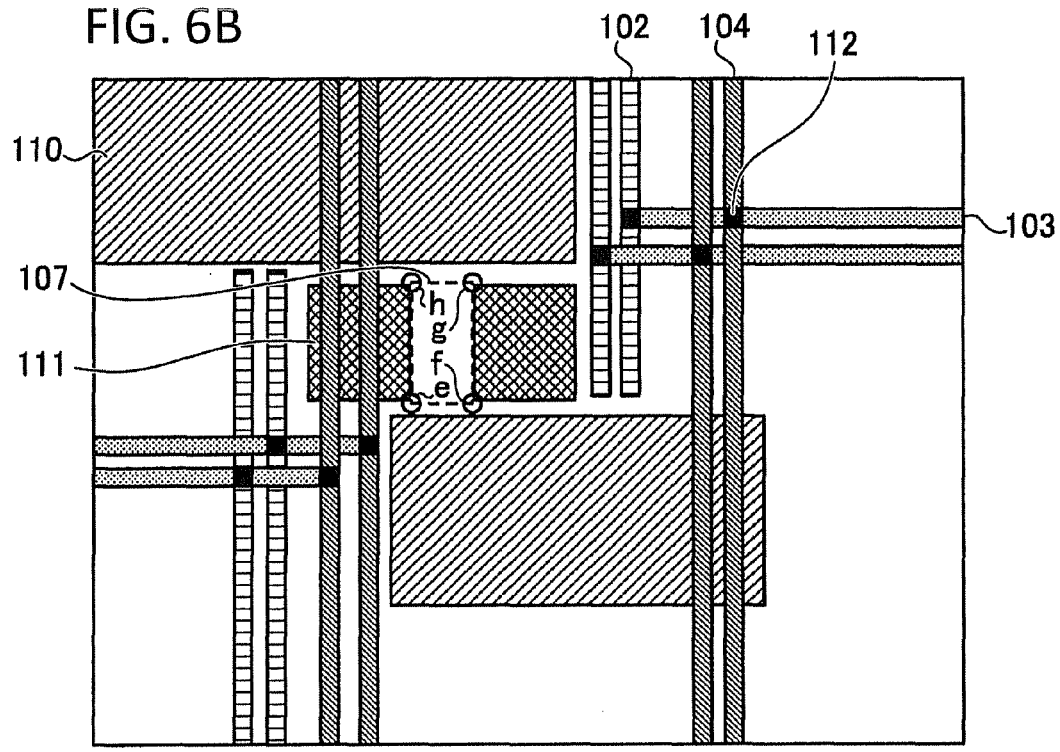
FIG. 6B is a diagram illustrating the row region 107 in which no power supply wiring is detected by a detection unit 403.

FIG. 6B is a diagram illustrating the row region 107 where no power supply wiring is detected by the detection unit 403. The row region 107 is a region defined by four points e, h, g, and f. The detection unit 403 detects a power supply wiring 102 of the layer A, which extends over coordinates within the row region 107, from the power supply wiring connection information 201 in the physical information 200. No power supply wiring 102 of the layer A extends over the row region 107. Therefore, the row region 107 is a region having a projection area located thereabove where no power supply wiring 102 of the layer A is detected. The row region 107 is therefore a region where no power supply wiring is formed and thus no power is supplied. Next, a region where a power supply wiring of a specific layer is detected will now be described with reference to FIG. 7.

Figure 7:
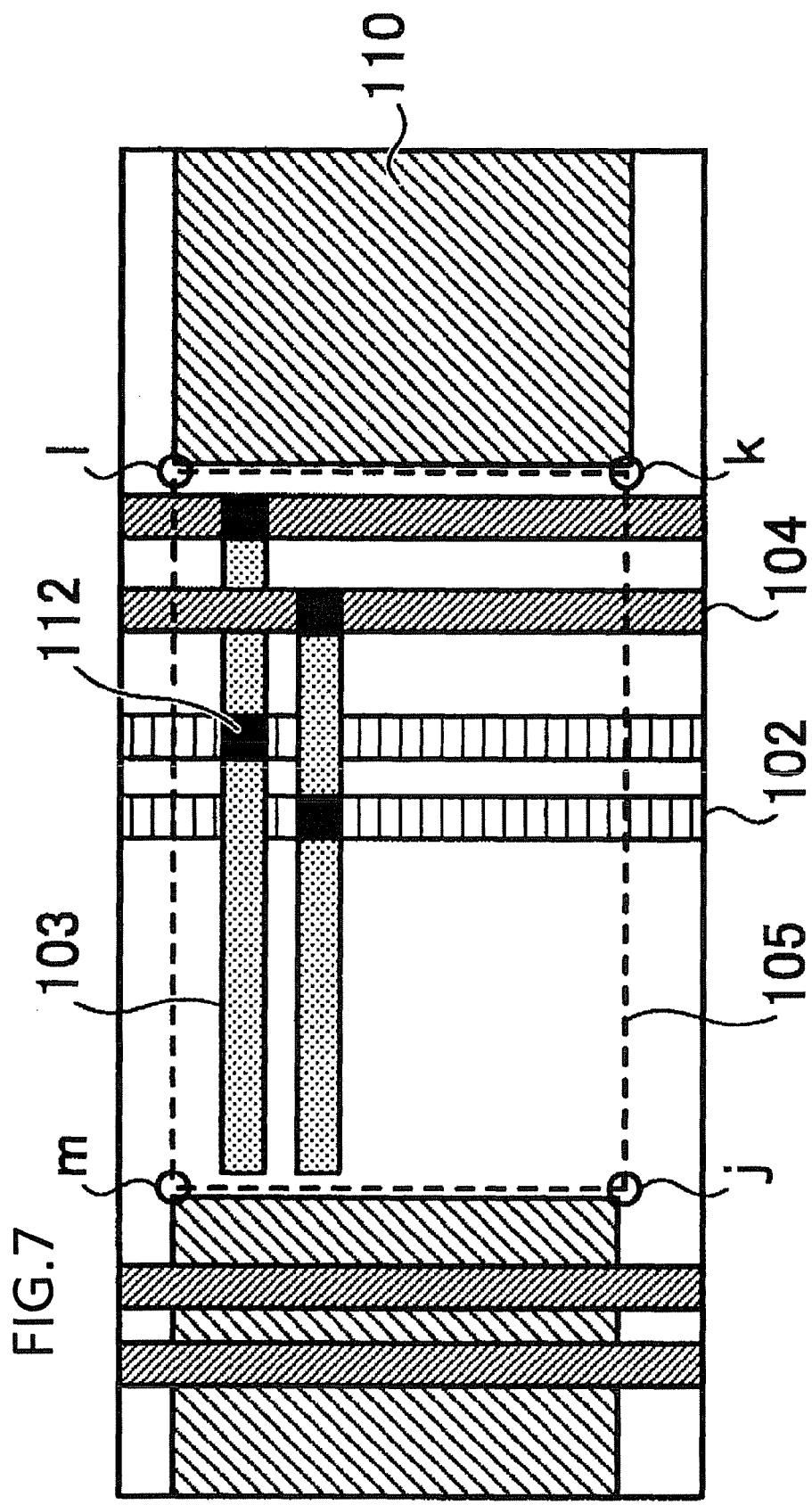
FIG. 7 is a diagram illustrating a row region 105 where a power supply wiring is detected by the detection unit 403.

FIG. 7 is a diagram illustrating a row region 105 where a power supply wiring is detected by the detection unit 403. The row region 105 is a region sandwiched between adjacent macro cells 110. The row region 105 is also a region defined by four points j, k, l, and m. The detection unit 403 detects power supply wirings 102 of the layer A, which extend over coordinates within the row region 105, from the power supply wiring connection information 201 in the physical information 200. A power supply wiring 102 of the layer A extends over the row region 105. Therefore, the row region 105 is a region having a projection area located thereabove where a power supply wiring 102 of the layer A is detected. The row region 105 is therefore a region where power is supplied.

In this way, a region including a power supply wiring is automatically detected from among the row regions 101 included in the layout represented by the layout data 100. This may save time for manually searching for a row region where no power is supplied (for example, the row regions 106 and 107). This may also provide quick discovery of a row region where no power is supplied. Therefore, an easy and quick layout of power supply wirings which is suitable for a semiconductor integrated circuit may be realized.

Referring back to FIG. 4, the insertion unit 404 inserts a connectable power supply wiring into a row region where no power supply wiring is detected by the detection unit 403. Specifically, for example, the CPU 301 reads the wiring width of the power supply wirings 102 of the layer A from the power supply wiring connection information 201 in the physical information 200. Then, the width of a power supply wiring 102 of the layer A to be inserted is set to the read wiring width. Next, the start and end X coordinate is set as the X coordinate of the center of the row region.

Figure 8A:
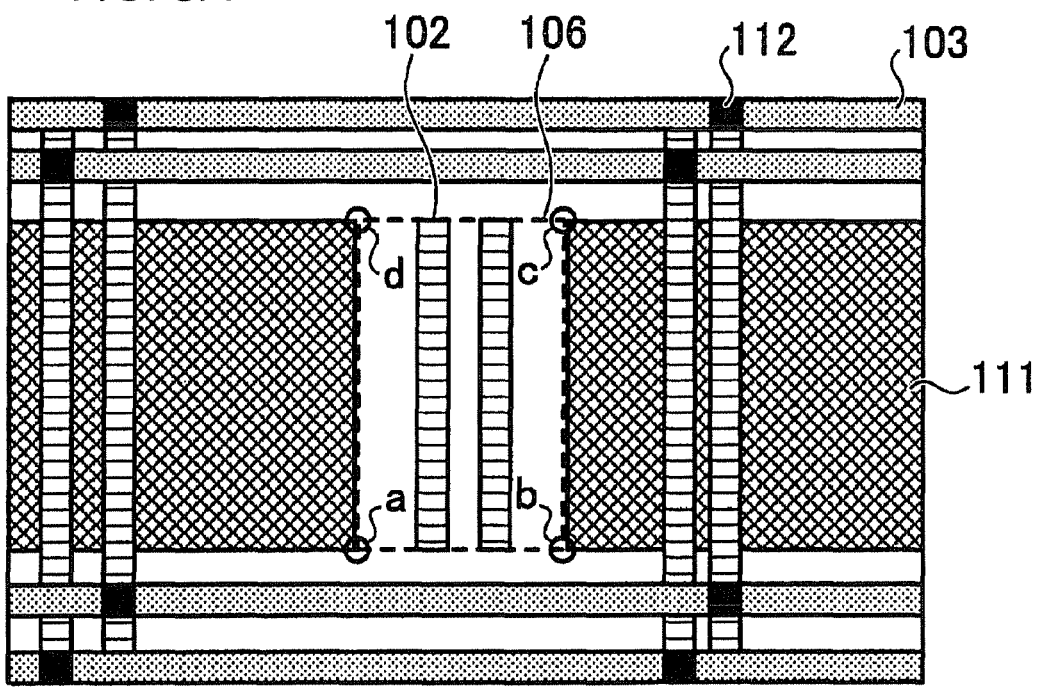
FIG. 8A is a diagram illustrating a row region 106 where a power supply wiring 102 of a layer A has been inserted.

The CPU 301 further sets the start Y coordinate to the minimum value of the Y coordinates of the row region. Then, the end Y coordinate is set to the maximum value of the Y coordinates of the row region. Next, information about the set power supply wiring 102 of the layer A is written in the power supply wiring connection information 201 in the physical information 200. FIG. 8A illustrates an example of the insertion of a power supply wiring of a specific layer.

FIG. 8A is a diagram illustrating the row region 106 where power supply wirings 102 of the layer A have been inserted. In FIG. 8A, the power supply wirings 104 of the layer C are not illustrated for ease of understanding. The power supply wirings 102 of the layer A are inserted in the Y-axis direction.

For example, the insertion unit 404 reads the width of the other power supply wirings 102 of the layer A, i.e., 5 μm, from the power supply wiring connection information 201 in the physical information 200. Next, the width of a power supply wiring 102 of the layer A to be inserted is set to 5 μm. Then, the start and end X coordinate is set to the value given by (X coordinate of point b−X coordinate of point a)/2. Further, the start Y coordinate is set to the value that is the greatest among the coordinates of the points a and b. Next, the end Y coordinate is set to the value that is the smallest among the coordinates of the points c and d. Then, the power supply wiring 102 of the layer A is inserted.

In this manner, the insertion unit 404 inserts a power supply wiring 102 of the layer A, thereby inserting a power supply wiring only in a row region where no power is supplied. Accordingly, only a required wiring may be inserted, resulting in efficient formation of a wiring in a region.

Referring back to FIG. 4, the determination unit 405 determines whether or not an extension of the power supply wiring inserted by the insertion unit 404 overlaps a macro cell other than the set of macro cells. That is, it is determined whether or not a macro cell including a wiring of the same or higher layer is located in an extension of the inserted power supply wiring. For example, a power supply wiring 102 of the layer A, which is to be inserted into the row region 106, overlaps no other macro cell even when the power supply wiring 102 is extended, which will be described below. However, for example, a power supply wiring 102 of the layer A, which is to be inserted into the row region 107, overlaps another macro cell when the power supply wiring 102 is extended, which will be described below.

Specifically, for example, the CPU 301 detects a macro cell, which is located in an extension of the start of the inserted power supply wiring 102 of the layer A along the Y axis, from the macro cell placement information 202 in the physical information 200. Then, if no macro cell is detected, it is determined that the inserted power supply wiring 102 of the layer A overlaps no other macro cell.

If a macro cell is detected, however, the maximum layer number in the range of layers that are used for the detected macro cell is read from the macro cell wiring layer information 203 in the physical information 200. Then, when the read maximum layer number is less than the number of the layer A, it is determined that the inserted power supply wiring 102 of the layer A overlaps no other macro cell. When the read maximum layer number is equal to or greater than the number of the layer A, the following processing is performed.

For example, the CPU 301 calculates the length from the detected macro cell to the start of the inserted power supply wiring 102 of the layer A. The calculated length is represented by E (in µm). Next, a power supply wiring 103 of the layer B, which is located in an extension of the start of the inserted power supply wiring 102 of the layer A along the Y axis, is detected from the power supply wiring connection information 201 in the physical information 200. Then, the distance from the closest power supply wiring 103 of the layer B to the start of the inserted power supply wiring 102 of the layer A is calculated. The calculated distance is represented by D (in µm).

When the distance E is greater than the distance D, the CPU 301 determines that the inserted power supply wirings 102 of the layer A overlaps no other macro cell. When the distance E is equal to or less than the distance D, however, it is determined that the inserted power supply wiring 102 of the layer A overlaps another macro cell. Further, processing similar to that described above is performed to determine whether or not an extension of the end of the inserted power supply wiring 102 of the layer A overlaps another macro cell.

For example, the CPU 301 repeatedly performs the operations of the insertion unit 404 and the determination unit 405, until the inserted power supply wiring has been connected to a power supply wiring of an upper layer. Therefore, a power supply wiring may be connected to a row region regardless of the placement positions of macro cells.

The process of determining whether or not an inserted power supply wiring overlaps a macro cell when the inserted power supply wiring is extended also is implemented using an existing layout design tool.

Figure 8B:
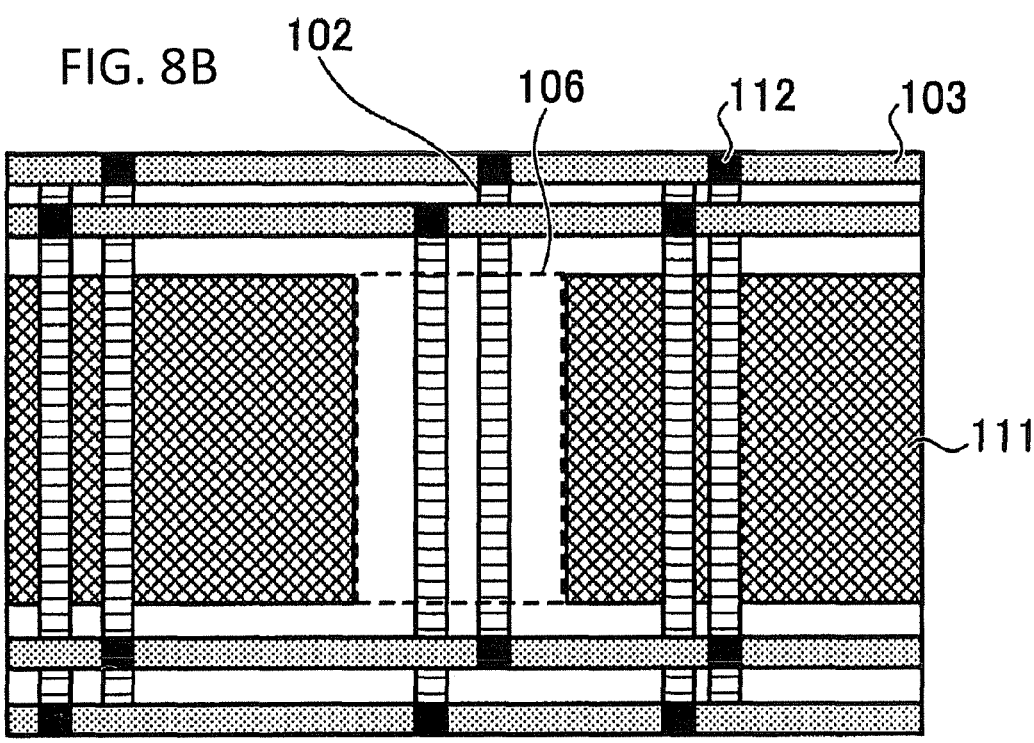
FIG. 8B is a diagram illustrating the row region 106 to which a power supply wiring is connected.

Then, when the determination unit 405 determines that the inserted power supply wiring overlaps no other macro cell, the connection unit 406 connects the power supply wiring 102 of the layer A to the power supply wiring 103 of the layer B. Specifically, for example, the CPU 301 detects portions, which are in an extension of each of the start and end of the inserted power supply wiring 102 of the layer A and which intersect the power supply wirings 103 of the layer B, from the power supply wiring connection information 201 in the physical information 200. Next, the coordinates of the start and end of the inserted power supply wiring 102 of the layer A are set to the coordinates of each of the intersection portions. Then, vias 112 are placed at the intersection portions. FIG. 8B illustrates an exemplary connection of a wiring that is determined by the determination unit 405 to overlap no other macro cell.

Figure 9A:
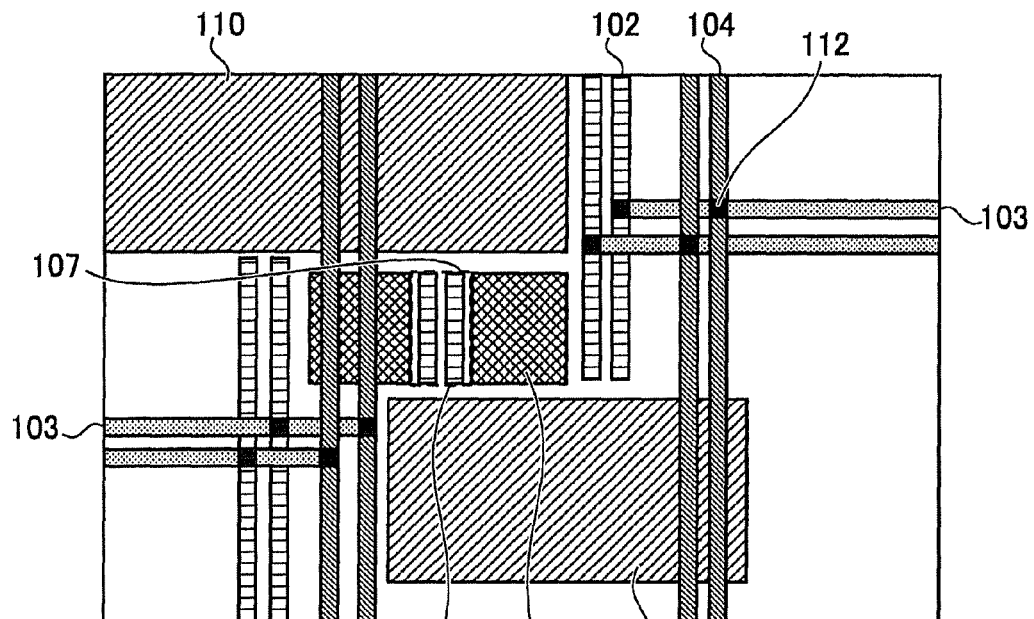
FIG. 9A is a diagram illustrating a row region 107 where a power supply wiring 102 of the layer A has been inserted.
Figure 9B:
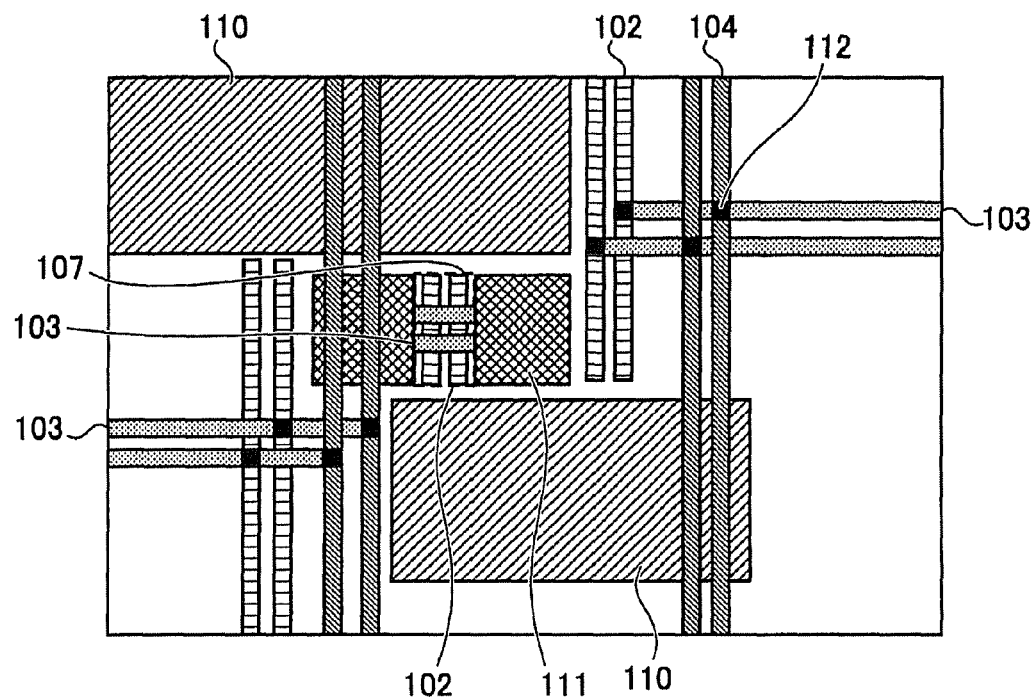
FIG. 9B is a diagram illustrating the row region 107 where a power supply wiring 103 of a layer B has been inserted.
Figure 9C:
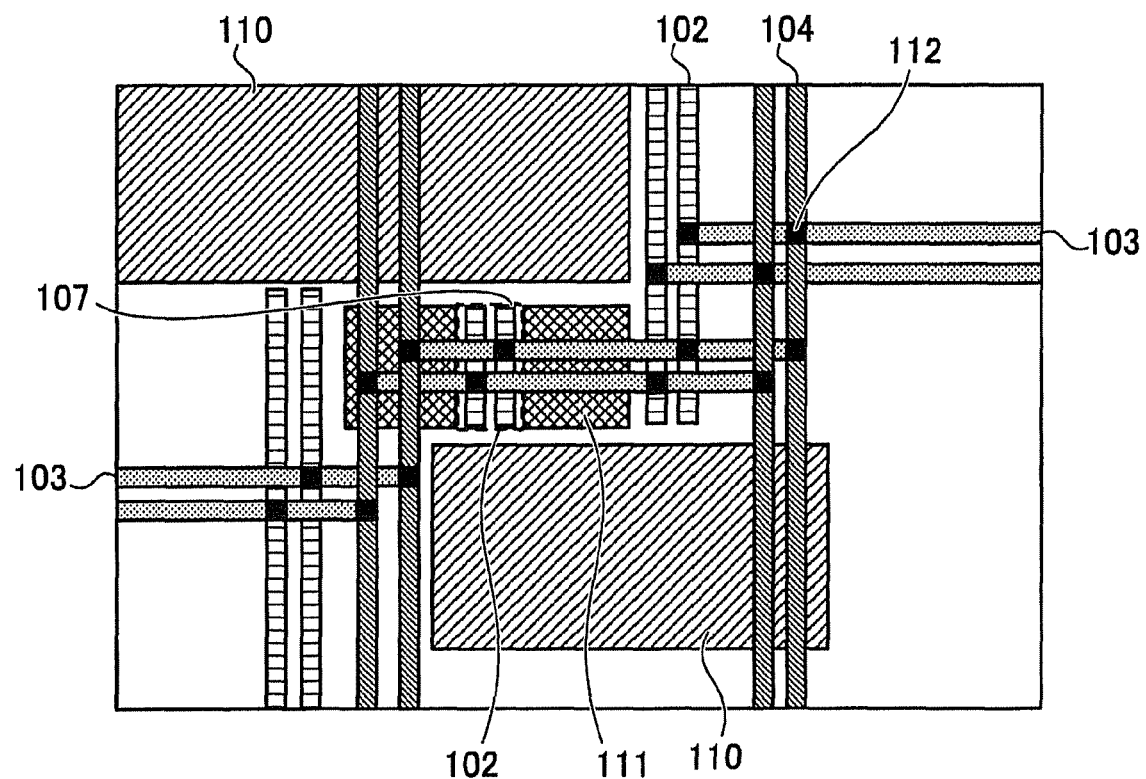
FIG. 9C is a diagram illustrating the row region 107 to which a power supply wiring is connected.

FIG. 8B is a diagram illustrating the row region 106 to which a power supply wiring is connected. In FIG. 8B, the power supply wirings 104 of the layer C are not illustrated for ease of understanding. No macro cell is located in an extension of the start and end of inserted power supply wirings 102 of the layer A. Therefore, it is determined that the power supply wirings 102 of the layer A overlap no other macro cell. Then, the inserted power supply wirings 102 of the layer A are extended so as to reach the portions intersecting the closest power supply wirings 103 of the layer B. The power supply wirings 102 of the layer A are connected to the power supply wirings 103 of the layer B through vias 112. FIGS. 9A to 9C illustrate an exemplary connection of a wiring that is determined to overlap another macro cell.

FIG. 9A is a diagram illustrating the row region 107 where power supply wirings 102 of the layer A have been inserted. In FIG. 9A, the power supply wirings 102 of the layer A are inserted in the row region 107 using a process similar to the process of inserting a power supply wiring in the row region 106.

FIG. 9B is a diagram illustrating the row region 107 where power supply wirings 103 of the layer B have been inserted. The macro cells 110 are located in extensions of the start and end of the inserted power supply wirings 102 of the layer A. Since the macro cells 110 have therein wirings of the layers below the layer C, the determination unit 405 determines that the inserted power supply wirings 102 of the layer A overlap another macro cell when the power supply wirings 102 are extended.

This prevents the connection unit 406 from connecting the inserted power supply wirings 102 of the layer A to the power supply wirings 103 of the layer B. Accordingly, power supply wirings 103 of the layer B are inserted using a process similar to that for inserting the power supply wirings 102 of the layer A.

FIG. 9C is a diagram illustrating the row region 107 to which a power supply wiring is connected. No other macro cell is located in extensions of the start and end of the inserted power supply wirings 103 of the layer B. In FIG. 9C, the macro cells 111 are viewed to be located in the extensions of the inserted power supply wirings 103 of the layer B. In actuality, however, the macro cells 111 have therein a wiring of the layer below the layer A. Thus, the macro cells 111 are not in the extensions of the power supply wirings 103 of the layer B.

Therefore, the determination unit 405 determines that the inserted power supply wirings 103 of the layer B overlap no other macro cell when the inserted power supply wirings 103 of the layer B are extended. Then, the inserted power supply wirings 103 of the layer B are extended so as to reach the portions intersecting the power supply wirings 104 of the layer C. The inserted power supply wirings 103 of the layer B are connected to the power supply wirings 104 of the layer C through vias 112. The previously inserted power supply wirings 102 of the layer A are connected to the inserted power supply wirings 103 of the layer B through vias 112.

Accordingly, a power supply wiring is connected to a row region where no power supply wiring is formed and thus no power is supplied. This may save time for manually inserting a power supply wiring.

Therefore, a layout of power supply wirings in a semiconductor integrated circuit may be quickly realized. Additionally, any inconvenience caused by no power being supplied may be avoided.

Referring back to FIG. 4, the output unit 407 outputs a row region where no power supply wiring is detected by the detection unit 403. The output unit 407 also outputs a result obtained by inserting a power supply wiring into this row region and connecting the power supply wiring to this row region using the insertion unit 404 and the connection unit 406. Specifically, for example, the CPU 301 outputs the coordinates of the row region. Layout data for providing a layout in which a power supply wiring has been inserted into and connected to the row region is also output. The output coordinates of the row region and the output layout data are stored in a storage device such as the RAM 303, the magnetic disk 305, or the optical disk 307, or are displayed on the display 308.

(Design Support Process Procedure for Design Support Apparatus)

Figure 10:
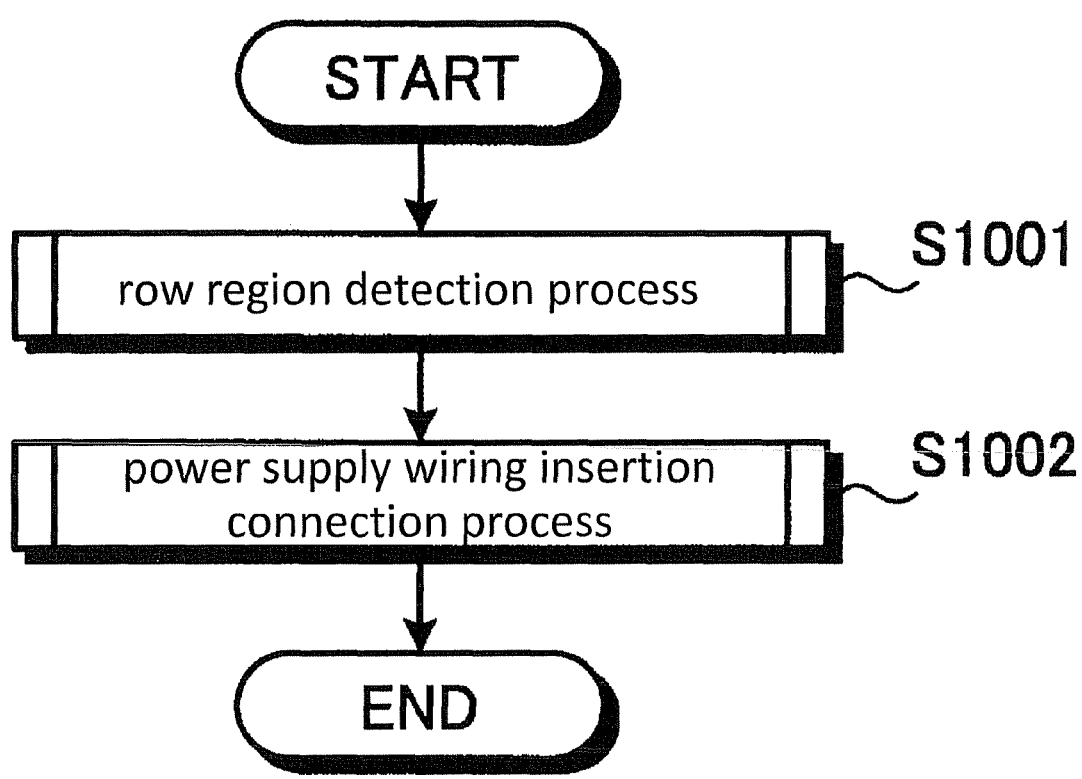
FIG. 10 is a flowchart illustrating a design support process procedure for the design support apparatus according to the first embodiment.

Next, a design support process procedure for the design support apparatus 400 according to the first embodiment will be described. FIG. 10 is a flowchart illustrating a design support process procedure for the design support apparatus 400 according to the first embodiment. In FIG. 10, first, a row region detection process is performed to detect a row region where no power supply wiring is formed from layout data for providing a layout in which macro cells are arranged and in which power supply wirings are formed at certain intervals in each wiring layer (step S1001). Next, a power supply wiring insertion and connection process is performed to insert a power supply wiring into the detected row region and connect the power supply wiring to the row region (step S1002). Then, the series of processes ends.

Figure 11:
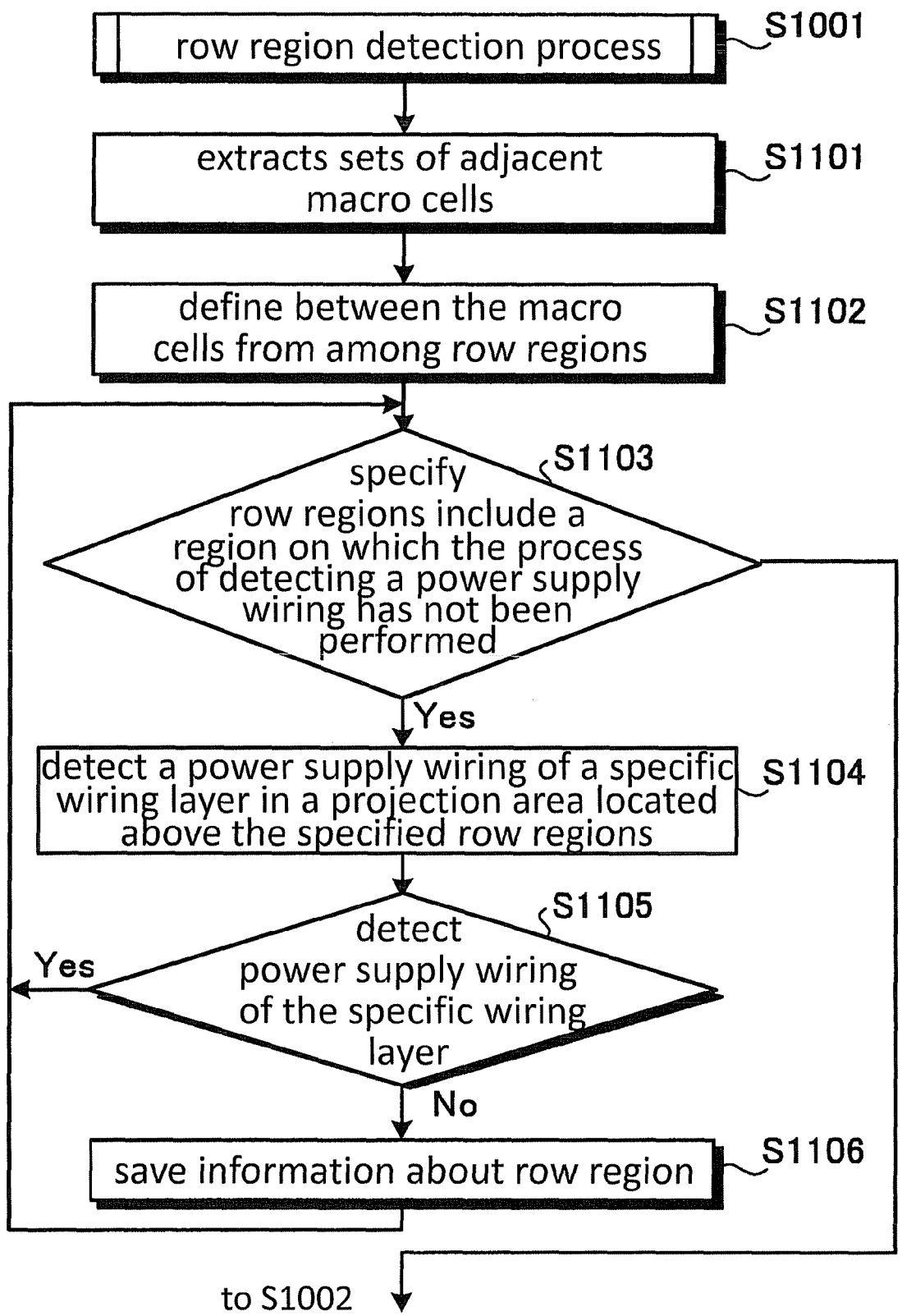
FIG. 11 is a flowchart illustrating a row region detection process procedure.

The row region detection process (step S1001) described above will now be described. FIG. 11 is a flowchart illustrating a row region detection process procedure. First, the extraction unit 401 extracts sets of adjacent macro cells (step S1101), and the specifying unit 402 specifies regions defined between the macro cells from among row regions (step S1102). It is determined whether or not the specified row regions include a region on which the process of detecting a power supply wiring has not been performed (step S1103).

If it is determined that the specified row regions do not include a region on which the process of detecting a power supply wiring has not been performed (No in step S1103), the procedure proceeds to step S1002. If it is determined that the specified row regions include a region on which the process of detecting a power supply wiring has not been performed (Yes in step S1103), the detection unit 403 performs the process of detecting a power supply wiring of a specific wiring layer in a projection area located above the specified row regions (step S1104). The determination unit 405 determines whether or not a power supply wiring of the specific wiring layer is detected (step S1105).

When it is determined that a power supply wiring of the specific wiring layer is detected (Yes in step S1105), the procedure returns to step S1103. When it is determined that no power supply wiring of the specific wiring layer is detected (No in step S1105), information about the row regions is saved (step S1106), and the procedure returns to step S1103.

Figure 12:
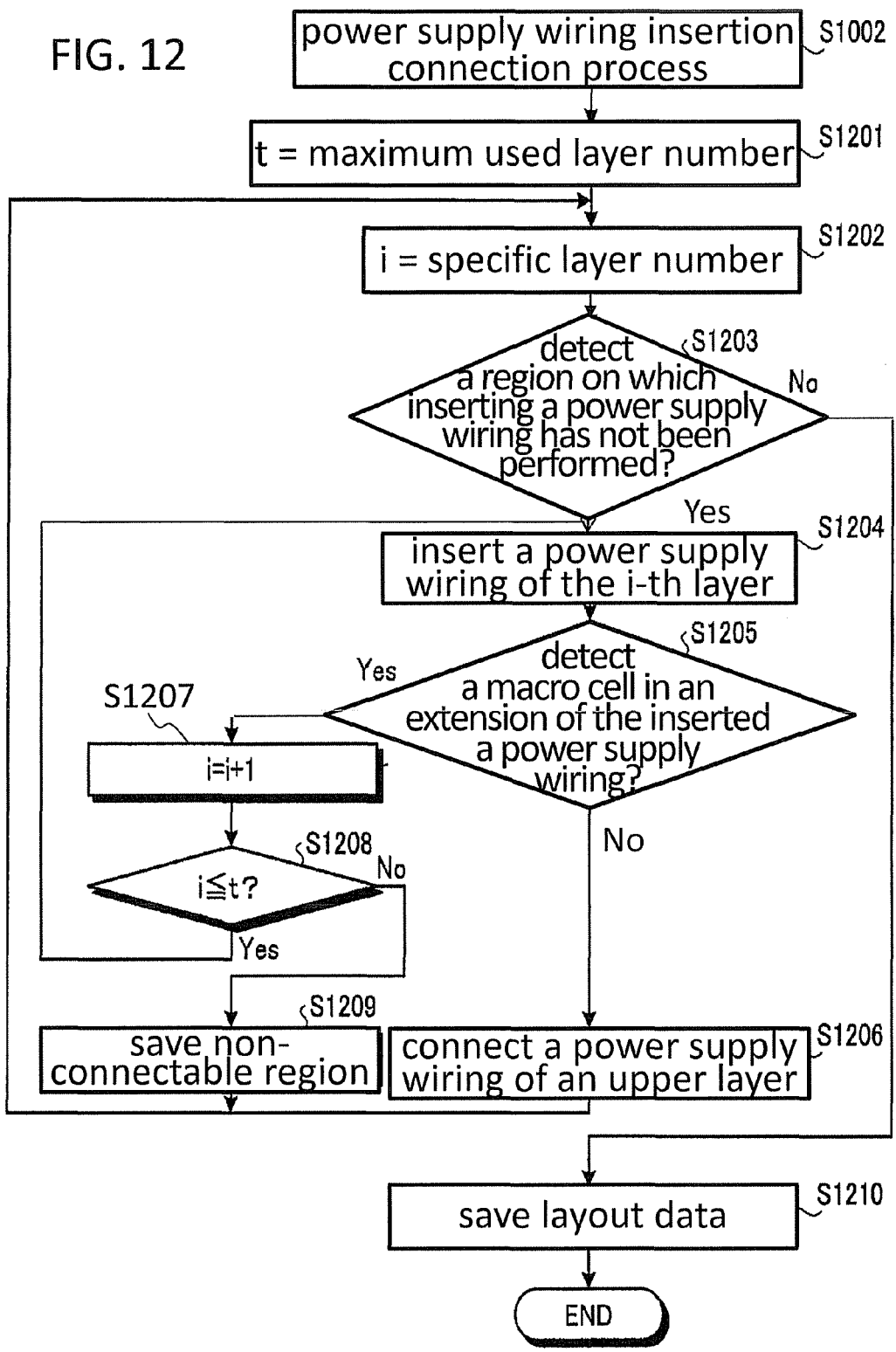
FIG. 12 is a flowchart illustrating a power supply wiring insertion and connection process.

The power supply wiring insertion and connection process (step S1002) described above will now be described. FIG. 12 is a flowchart illustrating a power supply wiring insertion and connection process. First, a value t is set as a maximum used layer number (step S1201). The term "maximum used layer number" means the number of the layer that is the highest among layer numbers used for a power supply wiring. Next, a value i is set as a specific layer number (step S1202). Then, it is determined whether or not the detected row regions include a region on which the process of inserting a power supply wiring has not yet been performed (step S1203). When it is determined that the detected row regions include a region on which the process of inserting a power supply wiring has not yet been performed (Yes in step S1203), then the insertion unit 404 inserts a power supply wiring of the i-th layer into a projection area located above the row regions (step S1204).

Then, the determination unit 405 determines whether or not a macro cell is in an extension of the inserted power supply wiring (step S1205). When it is determined that no macro cell is in the extension of the inserted power supply wiring (No in step S1205), the connection unit 406 extends the inserted power supply wiring and connects the inserted power supply wiring to a power supply wiring of an upper layer (step S1206). Then, the process returns to step S1202.

When it is determined that a macro cell is in the extension of the inserted power supply wiring (Yes in step S1205), the value i is increased by one (step S1207), and it is determined whether or not the resulting value i is equal to or less than the value t ($i \leq t$) (step S1208). When the value i is greater than the value t ($i > t$) (No in step S1208), the region is saved as a row region to which the power supply wiring is not connectable (step S1209), and the process returns to step S1202. When the value i is equal to or less than the value t ($i \leq t$) (Yes in step S1208), the process returns to step S1204.

When it is determined that the detected row regions do not include a region on which the process of inserting a power supply wiring has not yet been performed (No in step S1203), layout data for providing a layout in which a power supply wiring has been inserted is saved (step S1210), and the series of processes ends.

According to the first embodiment, a row region where no power supply wiring is formed and thus no power is supplied is automatically detected. Furthermore, a power supply wiring required to supply power may be inserted into and connected to the detected row region.

Overview of Second Embodiment

Next, a second embodiment will be described. In the first embodiment, a row region where no power supply wiring is formed and thus no power is supplied is detected from among row regions included in a layout represented by layout data. In the second embodiment, in contrast, a macro cell where no power supply wiring is formed and thus no power is supplied is extracted from among macro cells included in a layout represented by layout data. If the extracted macro cell has no power supply wiring thereabove that is connected to a power supply for the macro cell, no power is supplied to the extracted macro cell. This may save time for manually searching for a macro cell where no power is supplied. This may also provide quick discovery of a macro cell where no power is supplied.

Furthermore, a power supply wiring is automatically inserted into the extracted macro cell having no power supply wiring, thereby forming a power supply wiring in a desired portion to provide appropriate power supply. In the description of the second embodiment, the layout data 100 and the physical information 200, which are used in the first embodiment, are also used. Other elements that are the same as or similar to those described in the first embodiment will be assigned the same reference numerals and will not be discussed herein.

(Functional Configuration of Design Support Apparatus)

Figure 13:
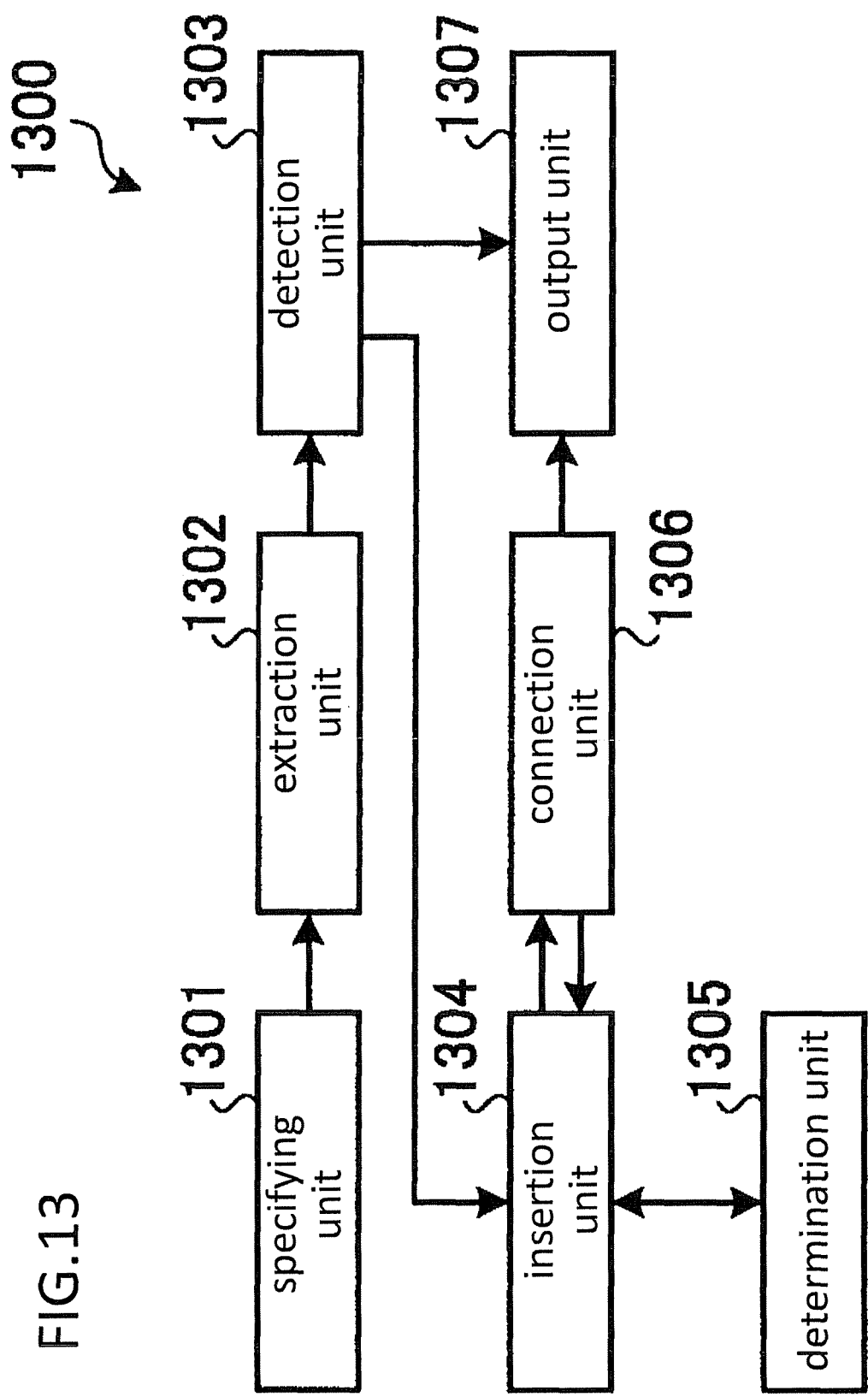
FIG. 13 is a block diagram illustrating the functional configuration of a design support apparatus according to a second embodiment.

FIG. 13 is a block diagram illustrating the functional configuration of a design support apparatus 1300 according to the second embodiment. The design support apparatus 1300 is configured to include a specifying unit 1301, an extraction unit 1302, a detection unit 1303, an insertion unit 1304, a determination unit 1305, a connection unit 1306, and an output unit 1307.

Specifically, the functions of the specifying unit 1301, the extraction unit 1302, the detection unit 1303, the insertion unit 1304, the determination unit 1305, the connection unit 1306, and the output unit 1307 are implemented by, for example, causing the CPU 301 illustrated in FIG. 3 to execute a program stored in a storage device such as the ROM 302, the RAM 303, the magnetic disk 305, or the optical disk 307 or are implemented by using the I/F 309.

The specifying unit 1301 specifies a power supply wiring that is connectable to each of the macro cells included in a layout represented by layout data 100. Specifically, for example, the CPU 301 searches for information about layers used for the macro cells included in the layout represented by the layout data 100 through the macro cell wiring layer information 203 in the physical information 200. The layer, which is higher than the layer of the maximum layer number used by a macro cell and which has the shortest layer distance from the layers used, is set to the layer of a power supply wiring that is connectable to the macro cell.

Actually, a layer that is the second closest to the layers used is also connectable to the power supply for the macro cell. In the present embodiment, however, for ease of understanding, only a layer having the shortest layer distance is used as the layer of a power supply wiring that is connectable to the power supply for the macro cell. The specified layer number is associated with the macro cell, and is held in a storage device such as the RAM 303, the magnetic disk 305, or the optical disk 307.

The extraction unit 1302 extracts a macro cell having a projection area located thereabove where no power supply wiring associated with the layer number specified by the specifying unit 1301 is formed from among the macro cells included in the layout represented by the layout data 100. Specifically, for example, the CPU 301 accesses the storage device and reads the specified layer number. Then, the coordinates of the individual macro cells are retrieved from the macro cell placement information 202 in the physical information 200. Next, a power supply wiring of the specified layer number, which extends over the coordinates of the individual macro cells, is retrieved from the power supply wiring connection information 201 in the physical information 200. Then, a macro cell where no power supply wiring of the specified layer number is formed is extracted.

The extracted macro cell is a macro cell where no power is supplied. In the second embodiment, such a macro cell where no power is supplied is automatically extracted. Additionally, a power supply wiring is automatically inserted into and connected to the extracted macro cell. The extracted macro cell is held in a storage device such as the RAM 303, the magnetic disk 305, or the optical disk 307.

Then, the detection unit 1303 detects a set of power supply wirings between which the extracted macro cell is located from among power supply wirings associated with the layer number specified by the specifying unit 1301. Specifically, for example, the CPU 301 detects the coordinates of the extracted macro cell from the macro cell placement information 202 in the physical information 200. The CPU 301 then detects the power supply wiring of the specified layer number, which is the closest to the smallest X coordinate (or Y coordinate) of the macro cell in the positive X-axis (or Y-axis) direction from the power supply wiring connection information 201 in the physical information 200.

Figure 14:
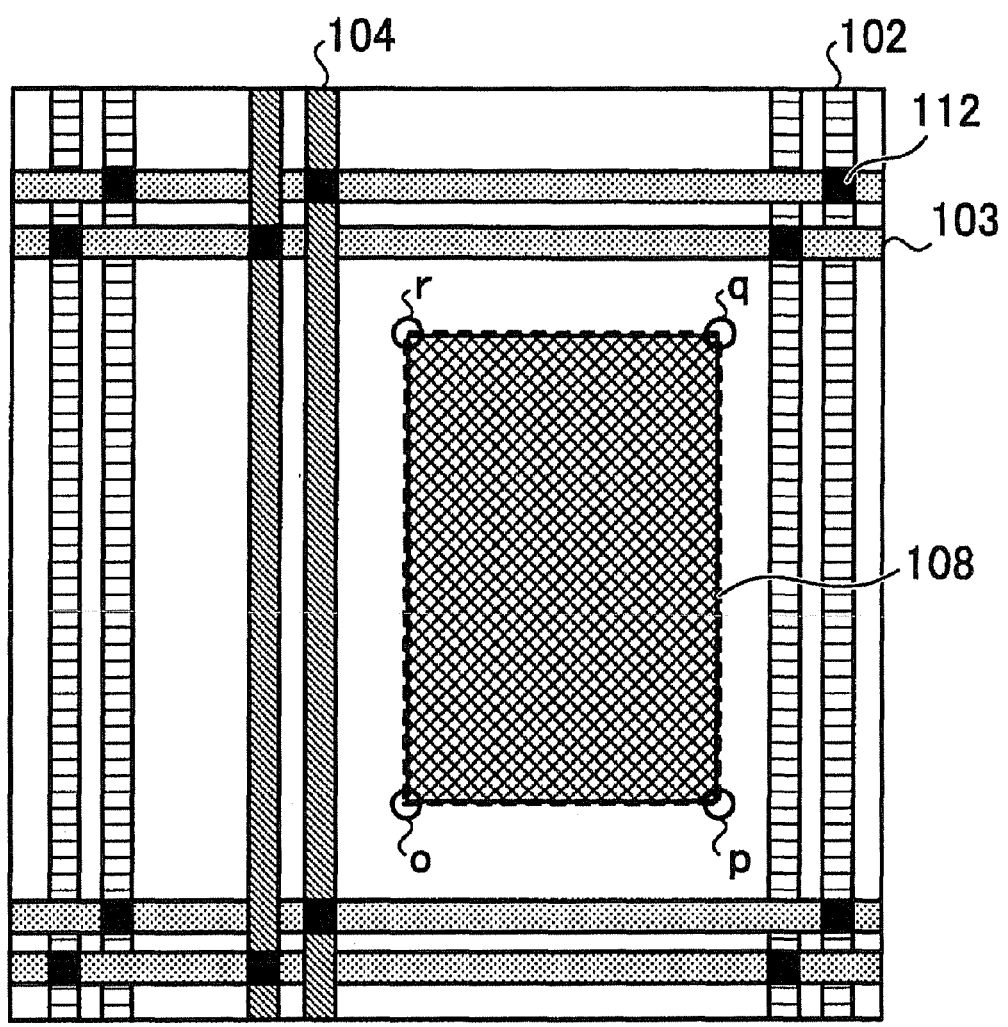
FIG. 14 is a diagram illustrating a set of specific power supply wirings between which a macro cell 108 is located.

Next, the power supply wiring of the specified layer, which is the closest to the end of the macro cell in the positive X-axis (or Y-axis) direction is detected from the power supply wiring connection information 201 in the physical information 200. The detected power supply wirings are used as a set of power supply wirings between which the macro cell is located. The set of power supply wirings between which the macro cell is located is associated with the macro cell and is held in a storage device such as the RAM 303, the magnetic disk 305, or the optical disk 307. FIG. 14 illustrates a method for detecting a set of specific power supply wirings.

FIG. 14 is a diagram illustrating a set of specific power supply wirings between which the macro cell 108 is located. The specific power supply wirings between which the macro cell 108 is located are power supply wirings 102 of the layer A. The macro cell 108 is a macro cell having a projection area located thereabove where no power supply wiring of a specified layer is formed. The macro cell 108 is also a region defined by dots o, p, q, and r. First, the detection unit 1303 calculates the coordinates of the points o, p, q, and r.

Then, the detection unit 1303 searches for the closest power supply wiring in the negative direction relative to the X coordinate of the point o (or r) among the power supply wirings of the specified layer. Next, the detection unit 1303 detects the closest power supply wiring in the positive direction relative to the X coordinate of the point p (or q) among the power supply wirings of the specified layer.

Referring back to FIG. 13, the insertion unit 1304 inserts a power supply wiring associated with the layer number specified by the specifying unit 1301 into a projection area located above the macro cell extracted by the extraction unit 1302. Specifically, for example, the CPU 301 reads the wiring width of the other power supply wirings 102 of the layer A from the power supply wiring connection information 201 in the physical information 200. Then, the width of the power supply wiring 102 of the layer A to be inserted is set to the read wiring width. Next, the start and end X coordinate is set as the X coordinate of the center of the macro cell.

Figure 15:
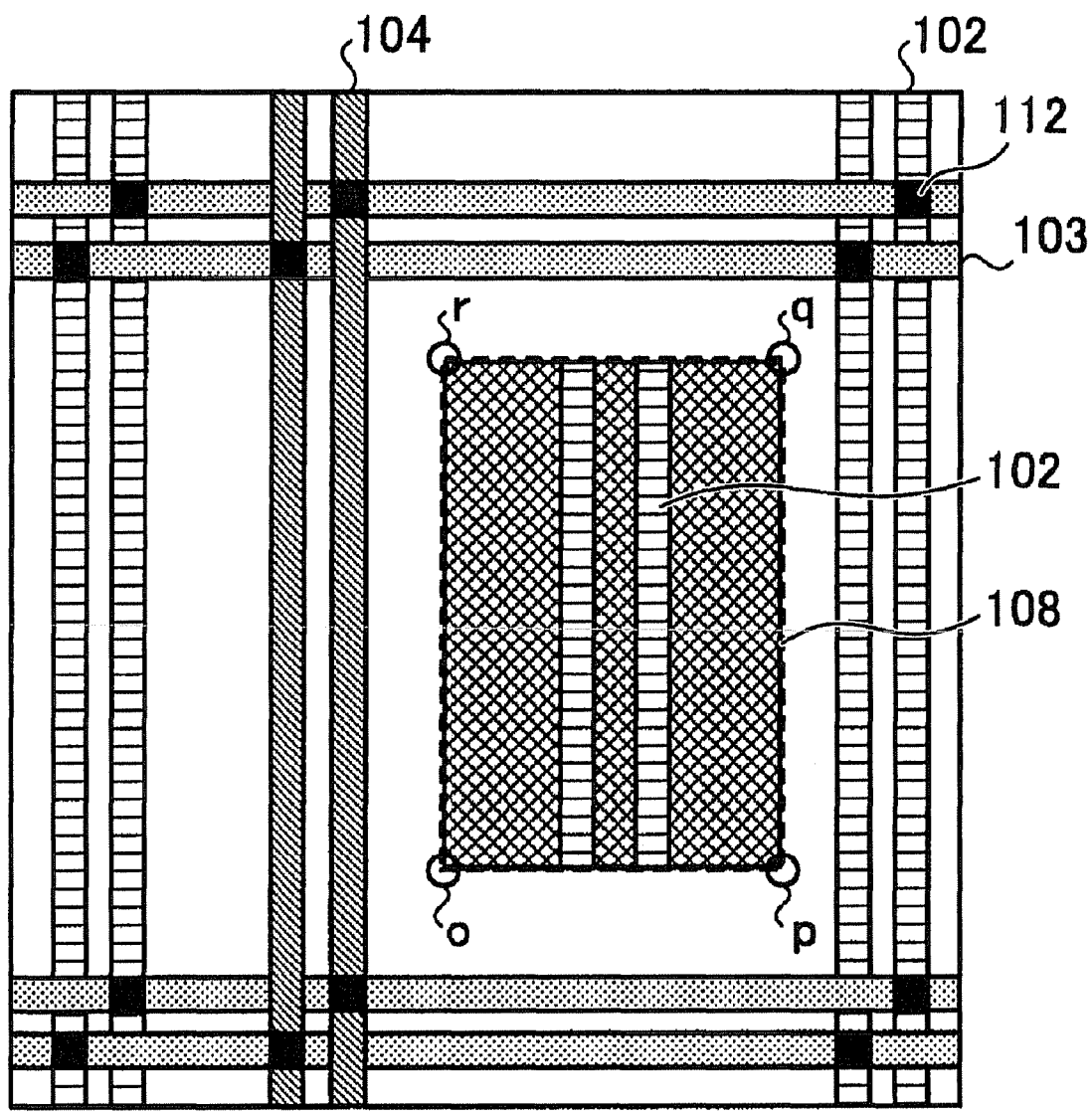
FIG. 15 is a diagram illustrating the macro cell 108 where a power supply wiring 102 of the layer A has been inserted.

The CPU 301 further sets the start Y coordinate to the minimum value of the Y coordinates of the macro cell. Then, the end Y coordinate is set to the maximum value of the Y coordinates of the macro cell. Then, information about the set power supply wiring 102 of the layer A is written in the power supply wiring connection information 201 in the physical information 200. FIG. 15 illustrates the insertion of a power supply wiring of a specific layer.

FIG. 15 is a diagram illustrating the macro cell 108 where power supply wirings 102 of the layer A have been inserted. The power supply wirings 102 of the layer A are inserted in the Y-axis direction.

For example, the insertion unit 1304 reads the width of the other power supply wirings 102 of the layer A, i.e., 5 μm, from the power supply wiring connection information 201 in the physical information 200. Next, the width of a power supply wiring 102 of the layer A to be inserted is set to 5 μm. Then, the start and end X coordinate is set to the value given by (X coordinate of point p−X coordinate of point o)/2. Further, the start Y coordinate is set to the value that is the greatest among the coordinates of the points o and p. Next, the end Y coordinate is set to the value that is the smallest among the coordinates of the points q and r. Then, the power supply wiring 102 of the layer A is inserted.

In this manner, the insertion unit 1304 inserts a power supply wiring 102 of the layer A, thereby inserting a power supply wiring only into a macro cell where no power is supplied. Accordingly, only a required wiring may be inserted, resulting in efficient formation of a wiring in a region.

Referring back to FIG. 13, the determination unit 1305 determines whether or not an extension of the power supply wiring inserted by the insertion unit 1304 overlaps another macro cell. That is, it is determined whether or not a macro cell including a wiring of the same layer or higher layer is located in an extension of the inserted power supply wiring. For example, a power supply wiring 102 of the layer A, which is to be inserted into the macro cell 108, overlaps no other macro cell even when the power supply wiring 102 is extended, which will be described below. However, for example, a power supply wiring 102 of the layer A, which is to be inserted in the macro cell 109, overlaps another macro cell when the power supply wiring 102 is extended, which will be described below.

Specifically, for example, the CPU 301 detects a macro cell, which is located in an extension of the start of the inserted power supply wiring 102 of the layer A along the Y axis, from the macro cell placement information 202 in the physical information 200. Then, if no macro cell is detected, it is determined that the inserted power supply wiring 102 of the layer A overlaps no other macro cell.

If a macro cell is detected, however, the maximum layer number in the range of layers that are used for the detected macro cell is read from the macro cell wiring layer information 203 in the physical information 200. Next, when the read maximum layer number is less than the number of the layer A, it is determined that the inserted power supply wiring 102 of the layer A overlaps no other macro cell. When the read maximum layer number is equal to or greater than the number of the layer A, the following processing is performed.

For example, the CPU 301 calculates the length between the detected macro cell and the start of the inserted power supply wiring 102 of the layer A. The calculated length is represented by F (in μm). Next, a power supply wiring 103 of the layer B, which is located in an extension of the start of the inserted power supply wiring 102 of the layer A, is detected from the power supply wiring connection information 201 in the physical information 200. Then, the distance between the closest power supply wiring 103 of the layer B and the start of the inserted power supply wiring 102 of the layer A is calculated. The calculated distance is represented by G (in μm).

When the distance F is greater than the distance G, it is determined that the inserted power supply wiring 102 of the layer A overlaps no other macro cell when the inserted power supply wiring 102 is extended. When the distance F is equal to or less than the distance G, however, it is determined that inserted power supply wiring 102 of the layer A overlaps another macro cell. Further, processing similar to that described above is performed to determine whether or not an extension of the end of the inserted power supply wiring 102 of the layer A overlaps another macro cell.

For example, the CPU 301 repeatedly performs the operations of the insertion unit 1304 and the determination unit 1305 until the inserted power supply wiring has been connected to a power supply wiring of an upper layer. Therefore, a power supply wiring may be connected to a macro cell where no power supply wiring is formed regardless of the placement positions of macro cells.

The process of determining whether or not an inserted power supply wiring overlaps another macro cell when the inserted power supply wiring is extended is also implemented using an existing layout design tool.

Figure 16:
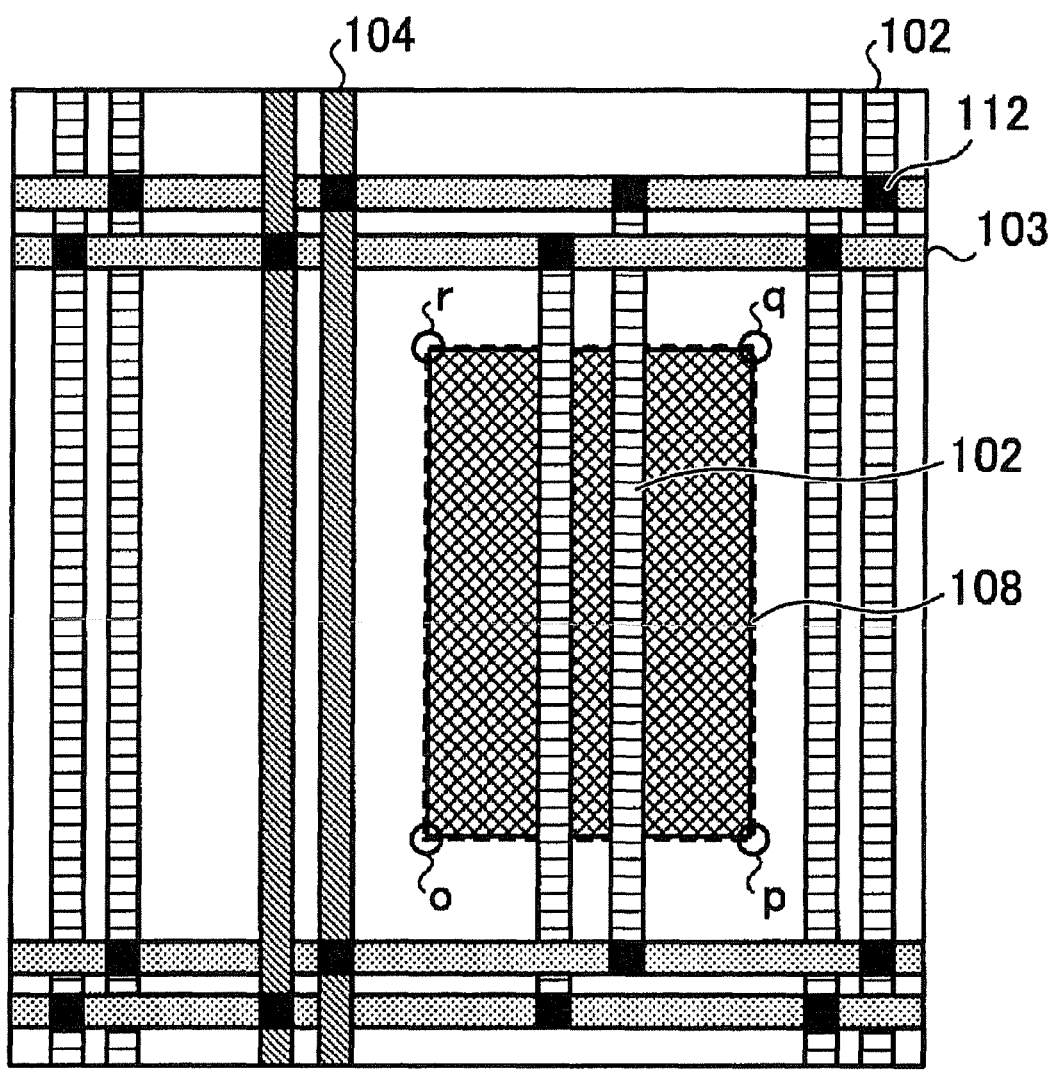
FIG. 16 is a diagram illustrating the macro cell 108 to which a power supply wiring is connected.

Next, when the determination unit 1305 determines that the inserted power supply wiring overlaps no other macro cell, the connection unit 1306 connects the power supply wiring 102 of the layer A to the power supply wiring 103 of the layer B. Specifically, for example, the CPU 301 detects portions intersecting the power supply wirings 103 of the layer B, which are in an extension of each of the start and end of the inserted power supply wiring 102 of the layer A, from the power supply wiring connection information 201 in the physical information 200. Next, the coordinates of the start and end of the inserted power supply wiring 102 of the layer A are set to the coordinates of each of the intersection portions. Then, vias 112 are placed at the intersection portions. FIG. 16 illustrates an exemplary connection of a wiring that is determined by the determination unit 1305 to overlap no other macro cell.

FIG. 16 is a diagram illustrating the macro cell 108 to which a power supply wiring are connected. No other macro cell is located in extensions of the start and end of inserted power supply wirings 102 of the layer A. Therefore, the power supply wirings 102 of the layer A are extended so as to reach the portions intersecting the power supply wirings 103 of the layer B. The power supply wirings 102 of the layer A are connected to the power supply wirings 103 of the layer B through vias 112. FIGS. 17A to 17D illustrate an exemplary connection of a wiring that is determined to overlap another macro cell.

Figure 17A:
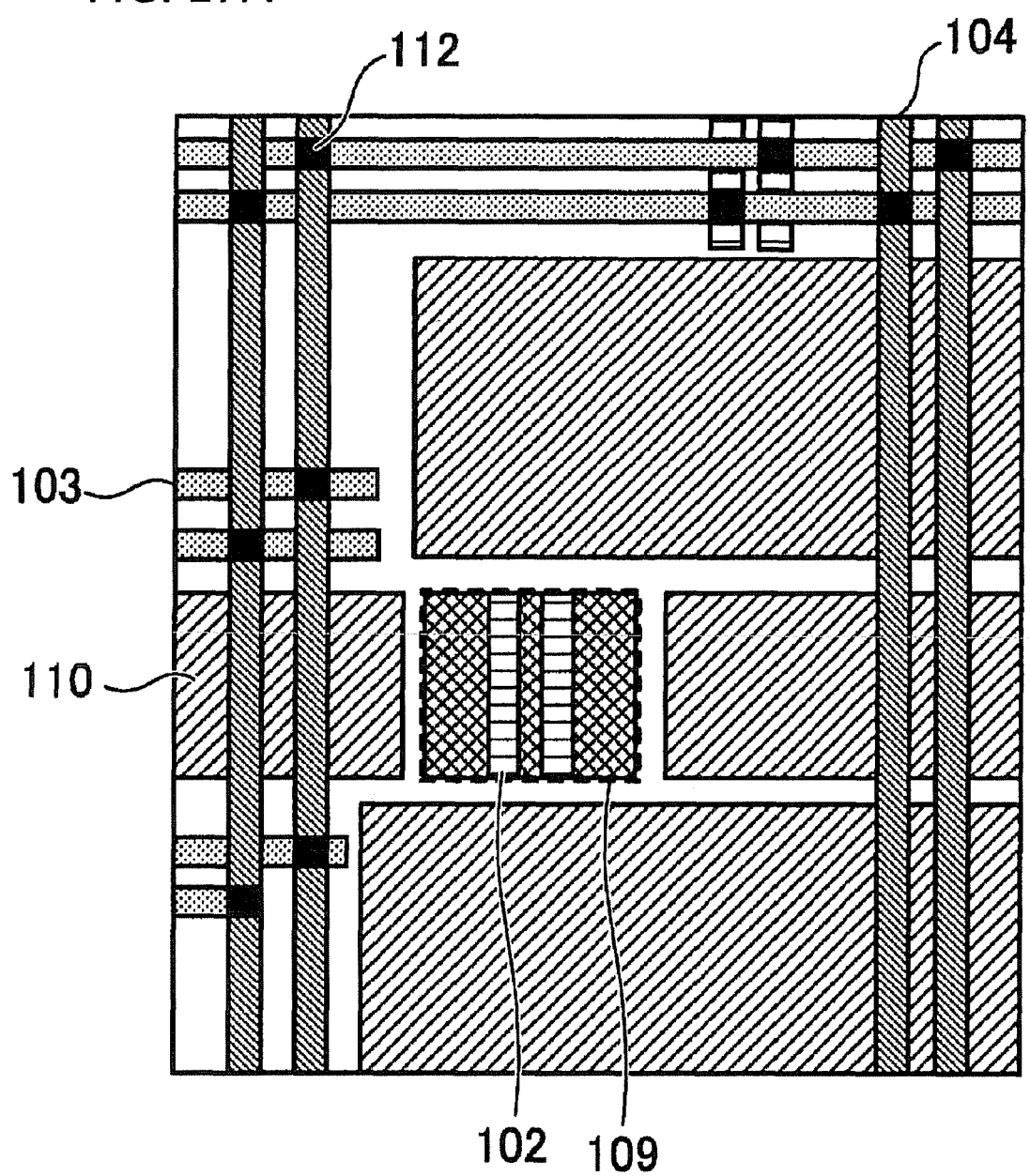
FIG. 17A is a diagram illustrating a macro cell 109 where a power supply wiring 102 of the layer A has been inserted.

FIG. 17A is a diagram illustrating the macro cell 109 where power supply wirings 102 of the layer A have been inserted. In FIG. 17A, the power supply wirings 102 of the layer A are inserted so as to extend over the macro cell 109 using a process similar to the process of inserting a power supply wiring in the macro cell 108.

Figure 17B:
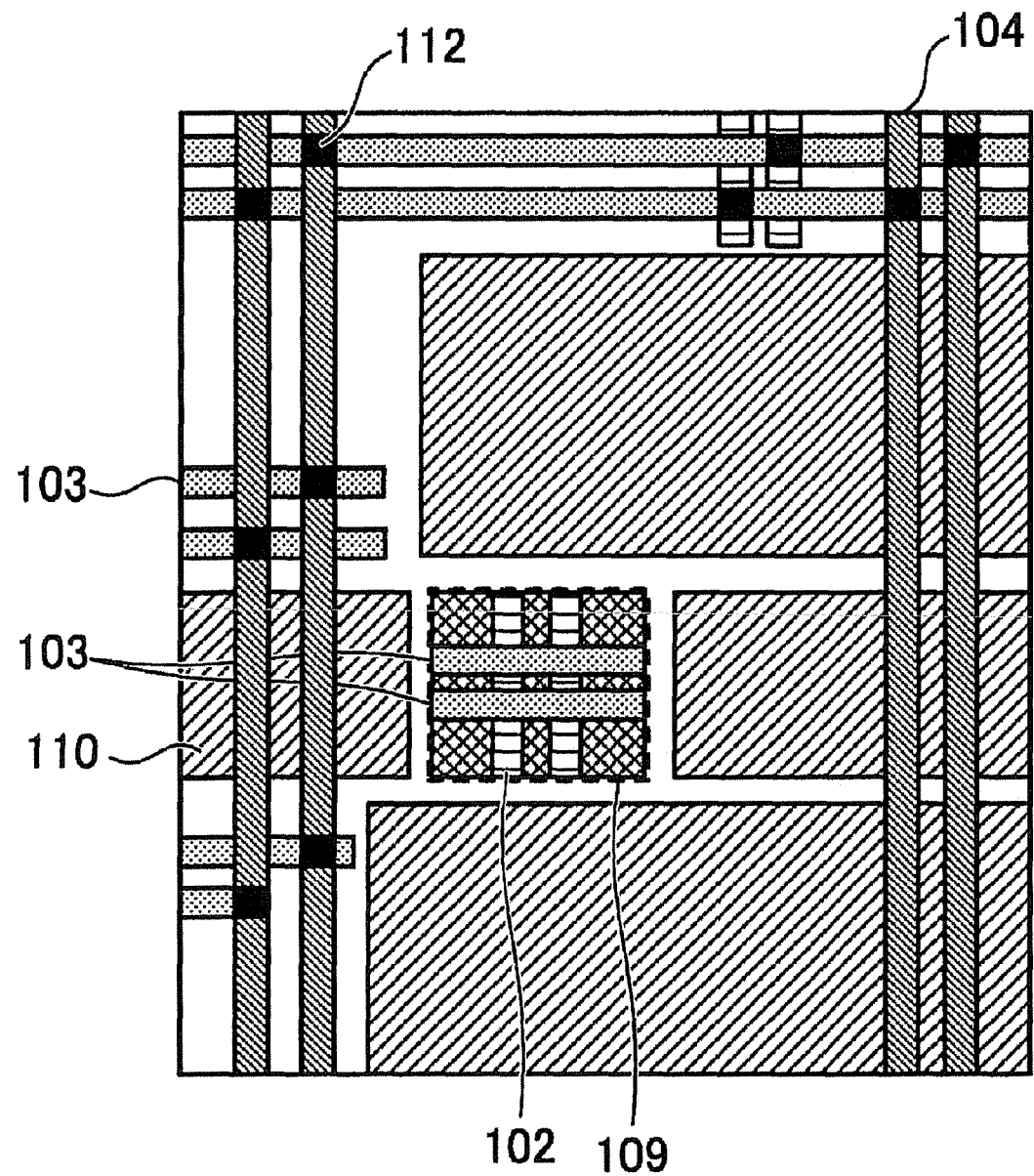
FIG. 17B is a diagram illustrating the macro cell 109 where a power supply wiring 103 of the layer B has been inserted.

FIG. 17B is a diagram illustrating the macro cell 109 where power supply wirings 103 of the layer B have been inserted. The macro cells 110 are located in extensions of the start and end of the inserted power supply wirings 102 of the layer A. Since the macro cells 110 have therein wirings of the layers below the layer A, the determination unit 1305 determines that the inserted power supply wirings 102 of the layer A overlap another macro cell.

This prevents the connection unit 1306 from connecting the inserted power supply wirings 102 of the layer A to the power supply wirings 103 of the layer B. Accordingly, the insertion unit 1304 inserts power supply wirings 103 of the layer B using a process similar to that for inserting the power supply wirings 102 of the layer A.

FIG. 17C is a diagram illustrating the macro cell 109 where power supply wirings 104 of the layer C have been inserted. The macro cells 110 are located in extensions of the start and end of the inserted power supply wirings 103 of the layer B. Since the macro cells 110 have therein wirings of the layers below the layer B, the determination unit 1305 determines that the inserted power supply wirings 103 of the layer B overlap another macro cell.

This prevents the connection unit 1306 from connecting the inserted power supply wirings 103 of the layer B to the power supply wirings 104 of the layer C. Accordingly, the insertion unit 1304 inserts power supply wirings 104 of the layer C using a process similar to that for inserting the power supply wirings 103 of the layer B.

Figure 17D:
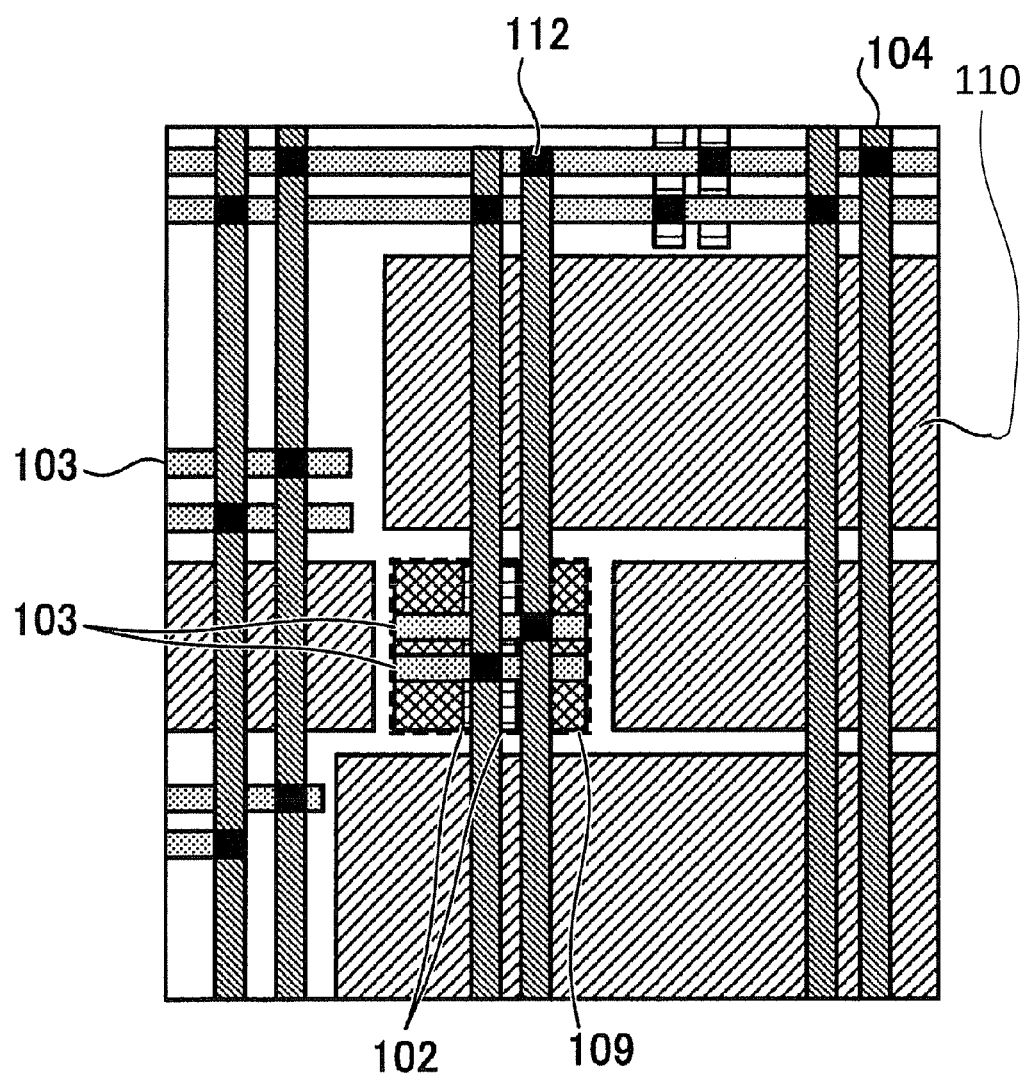
FIG. 17D is a diagram illustrating the macro cell 109 to which a power supply wiring is connected.

FIG. 17D is a diagram illustrating the macro cell 109 to which a power supply wiring is connected. No other macro cell is located in extensions of the start and end of the inserted power supply wirings 104 of the layer C. In FIG. 17D, the macro cells 110 are viewed to be located in the extensions of the inserted power supply wirings 104 of the layer C. In actuality, however, the macro cells 110 have therein wirings of the layers below the layer C. Thus, the macro cells 110 are not located on the extensions of the inserted the power supply wirings 104 of the layer C.

Therefore, the determination unit 1305 determines that the power supply wirings 104 of the layer C overlap no other macro cell. Then, the inserted power supply wirings 104 of the layer C are extended so as to reach the portions intersecting the power supply wirings 103 of the layer B. The inserted power supply wirings 104 of the layer C are connected to the power supply wirings 103 of the layer B, which are in extensions of the inserted power supply wirings 104 of the layer C, through vias 112. The previously inserted power supply wirings 102 of the layer A are connected to the inserted power supply wirings 103 of the layer B through vias 112. Furthermore, the inserted power supply wirings 103 of the layer B are connected to the inserted power supply wirings 104 of the layer C through vias 112.

Accordingly, a power supply wiring is connected to a macro cell where no power supply wiring is formed and thus no power is supplied, and any inconvenience caused by no power being supplied may be avoided. In addition, time for manually inserting a power supply wiring may be saved. Therefore, a layout of power supply wirings in a semiconductor integrated circuit may be quickly realized.

Referring back to FIG. 13, the output unit 1307 outputs a macro cell where no power supply wiring is formed, which is detected by the detection unit 1303, and a set of power supply wirings between which the detected macro cell is located. The output unit 1307 also outputs a result obtained by inserting a power supply wiring into this macro cell and connecting the power supply wiring to this macro cell using the insertion unit 1304 and the connection unit 1306. Specifically, the for example, the CPU 301 accesses the storage device, and outputs the coordinates of an extracted macro cell and a set of power wirings by which the extracted macro cell is located. The CPU 301 also outputs layout data for providing a layout in which a power supply wiring has been inserted into and connected to the macro cell. The output results are stored in a storage device such as the RAM 303, the magnetic disk 305, or the optical disk 307, or are displayed on the display 308.

(Design Support Process Procedure for Design Support Apparatus)

Figure 18:
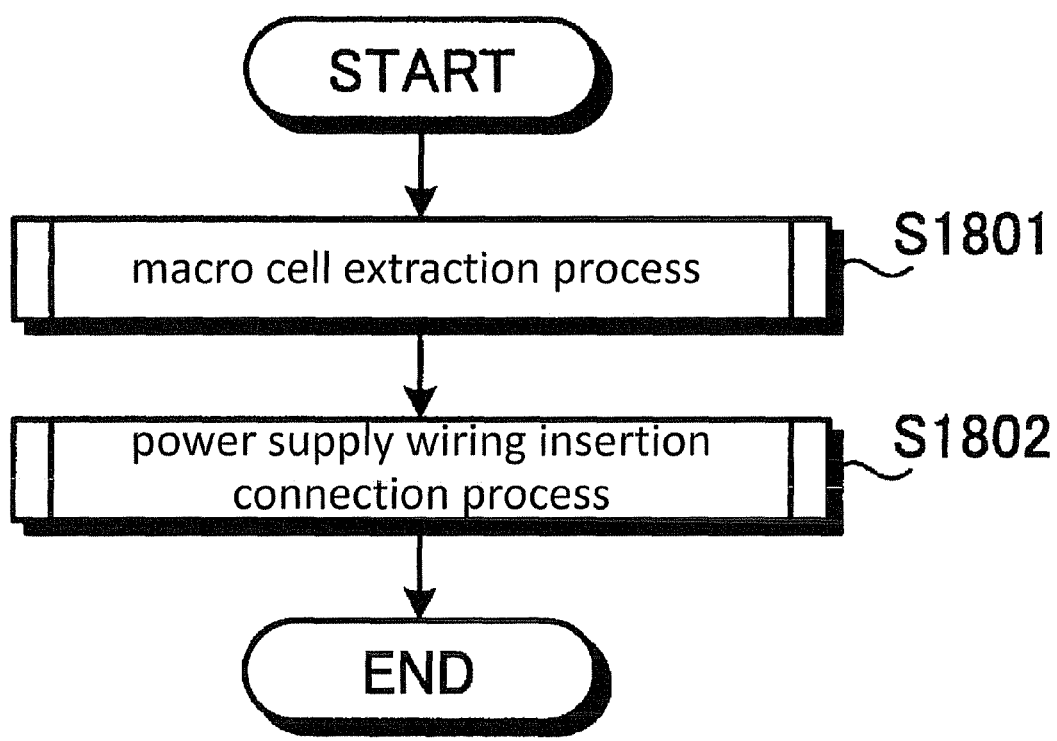
FIG. 18 is a flowchart illustrating a design support process procedure for the design support apparatus according to the second embodiment.

Next, a design support process procedure for the design support apparatus 1300 according to the second embodiment will be described. FIG. 18 is a flowchart illustrating a design support process procedure for a design support apparatus 1300 according to the second embodiment. In FIG. 18, first, a macro cell extraction process is performed to extract a macro cell where no power supply wiring is formed from layout data for providing a layout in which macro cells are arranged and in which power supply wirings are formed at certain intervals in each wiring layer (step S1801). Next, a power supply wiring insertion and connection process is performed on the extracted macro cell (step S1802). Then, the series of processes ends.

Figure 19:
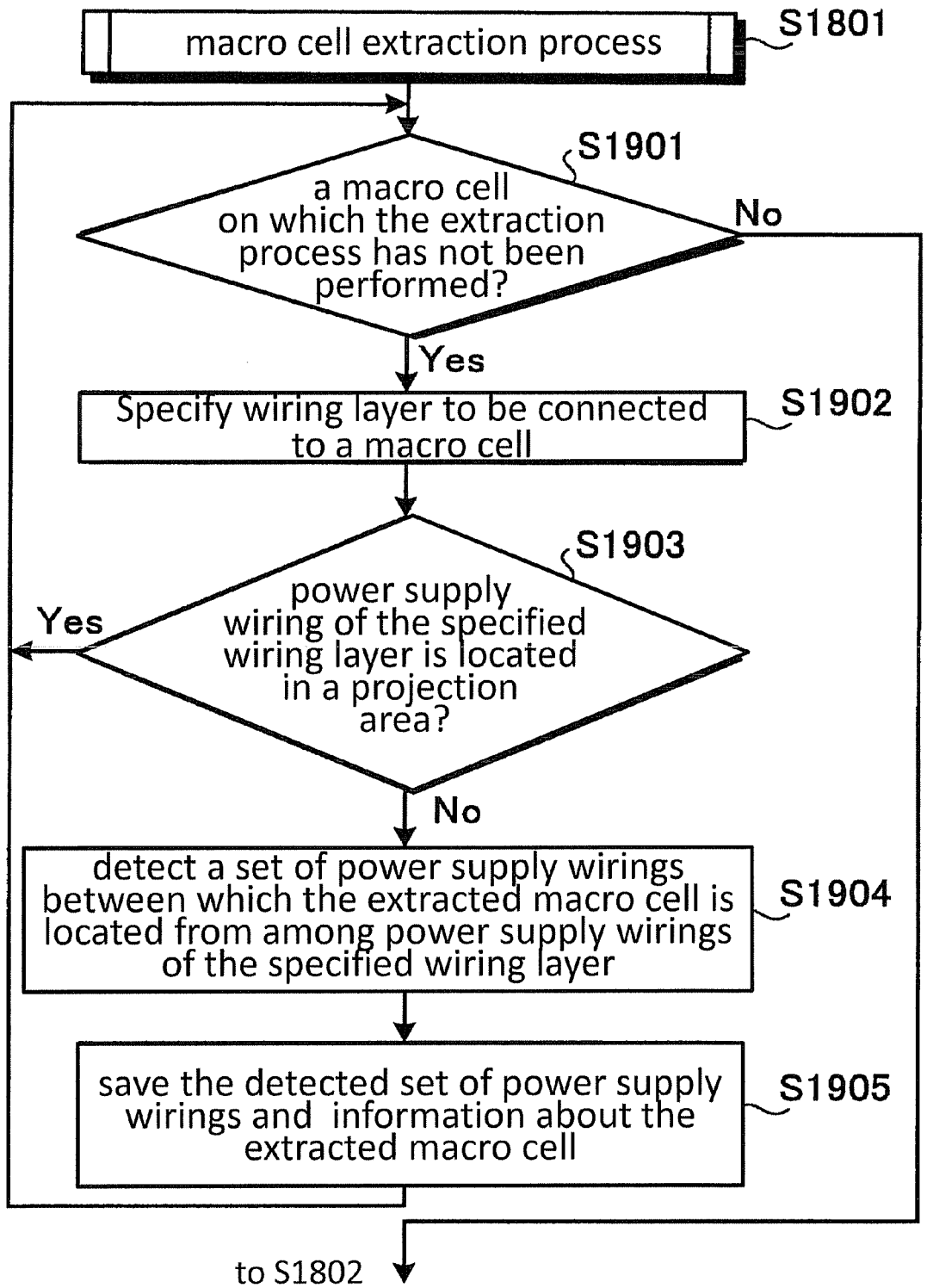
FIG. 19 is a flowchart illustrating a macro cell extraction process procedure.

The macro cell extraction process (step S1801) described above will now be described. FIG. 19 is a flowchart illustrating a macro cell extraction process procedure. First, it is determined whether or not there is a macro cell on which the extraction process has not been performed (step S1901). If it is determined that there is a macro cell on which the extraction process has not been performed (Yes in step S1901), the specifying unit 1301 specifies a wiring layer to be connected to the macro cell (step S1902). Next, the extraction unit 1302 determines whether or not a power supply wiring of the specified wiring layer is located in a projection area located above the macro cell (step S1903). If it is determined that the projection area located above the macro cell includes a power supply wiring of the specified wiring layer (Yes in step S1903), the process returns to step S1901.

If it is determined that no power supply wiring of the specified wiring layer is included in the projection area located above the macro cell (No in step S1903), the detection unit 1303 detects a set of power supply wirings between which the extracted macro cell is located from among power supply wirings of the specified wiring layer (step S1904), and the detected set of power supply wirings and information about the extracted macro cell are saved (step S1905). Then, the process returns to step S1901.

If it is determined that there is no macro cell on which the extraction process has not been performed (No in step S1901), the process proceeds to step S1802.

The power supply wiring insertion and connection process (step S1802) described above will now be described. FIG. 20 is a flowchart illustrating a power supply wiring insertion and connection process procedure. First, a value u is set as a maximum used layer number (step S2001). The term "maximum used layer number" means the number of the layer that is the highest among the layer numbers used for a power supply wiring. Next, it is determined whether or not the extracted macro cell is a macro cell on which the process of inserting a power supply wiring has not yet been performed (step S2002). When it is determined that the extracted macro cell is a macro cell on which the process of inserting a power supply wiring has not yet been performed (Yes in step S2002), a value s is set as the layer number of the power supply wiring that is connected (step S2003). Then, the insertion unit 1304 inserts a power supply wiring of the s-th layer into a projection area located above the macro cell (step S2004).

Next, the determination unit 1305 determines whether or not a macro cell is in an extension of the inserted power supply wiring (step S2005). When it is determined that no macro cell is in the extension of the inserted power supply wiring (No in step S2005), the connection unit 1306 extends the inserted power supply wiring and connects the inserted power supply wiring to a power supply wiring of an upper layer (step S2006). Then, the process returns to step S2002.

When it is determined that a macro cell is in the extension of the inserted power supply wiring (Yes in step S2005), the value s is increased by one (step S2007), and it is determined whether or not the resulting value s is equal to or less than the value u ($s \leq u$) (step S2008). When the value s is greater than the value u ($s > u$) (No in step S2008), the extracted macro cell is saved as a macro cell to which that the power supply wiring is not connectable (step S2009), and the process returns to step S2002. When the value s is equal to or less than the value u ($s \leq u$) (Yes in step S2008), the process returns to step S2004.

When it is determined that the extracted macro cell is not a macro cell on which the process of inserting a power supply wiring has not yet been performed (No in step S2002), layout data for providing a layout in which a power supply wiring has been inserted is saved (step S2010), and the series of processes ends.

In the second embodiment, a computer that is accessible to layout data for providing a layout in which macro cells are arranged and in which power supply wirings are formed at certain intervals in each wiring layer may be caused to extract a macro cell having a projection area located thereabove where no power supply wiring to be connected to the macro cell is formed from among the macro cells included in the layout represented by the layout data, and may be caused to output the extracted macro cell. Furthermore, a power supply wiring required to supply power may be inserted into and connected to the projection area located above the extracted macro cell.

According to the first embodiment, since power supply wirings are formed at certain intervals, a row region where no power supply wiring is formed is automatically detected. Furthermore, a power supply wiring required to supply power may be inserted into and connected to the detected row region.

According to the second embodiment, since power supply wirings are formed at certain intervals, a macro cell in which no power supply wiring is formed and thus no power is supplied is automatically detected. Furthermore, a power supply wiring required to supply power may be inserted into and connected to the detected macro cell.

The first and second design support methods and design support apparatuses achieve the effect of an easy and quick layout of power supply wirings which is suitable for in a semiconductor integrated circuit.

The design support methods described with respect to the first and second embodiments may be implemented by executing a predetermined program by using a computer such as a personal computer or a workstation. The program may be recorded on a computer-readable recording medium such as a hard disk, a flexible disk, a compact disk read-only memory (CD-ROM), a magneto-optical (MO) disk, or a digital versatile disk (DVD), and may be read from the recording medium by using a computer, to execute the program. The program may also be a medium that may be distributed via a network such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A design support method to cause a computer accessible to a storage device storing layout data to provide a layout in which macro cells that include semiconductor circuit elements are arranged and in which power supply wirings are formed at certain intervals in each wiring layer to execute, the design support method comprising:
   extracting, by the computer, a set of adjacent macro cells from the layout data;
   specifying a region located between macro cells that constitute the set of adjacent macro cells extracted in the extracting from among row regions included in the layout represented by the layout data;
   detecting a power supply wiring of a specific wiring layer in a projection area located above the region specified in the specifying, the specific wiring layer being higher than a bottom layer of the layout represented by the layout data; and
   outputting a region where no power supply wiring of the specific wiring layer is detected in the detecting.

2. The design support method according to claim 1, comprising:
   inserting a power supply wiring connectable to the row regions into the region where no power supply wiring of the specific wiring layer is detected; and
   connecting the power supply wiring to a power supply wiring of the specific wiring layer by extending the inserted power supply wiring, and
   wherein layout data is output, the layout data providing a layout in which the power supply wiring connectable to the row regions has been connected in the connecting.

3. The design support method according to claim 2, comprising:
   determining whether or not the power supply wiring connectable to the row regions overlaps a macro cell other than the set of adjacent macro cells when the power supply wiring is extended,
   wherein when it is determined in the determining that the power supply wiring connectable to the row regions overlaps another macro cell, the inserting further inserts a second power supply wiring connectable to the power supply wiring connectable to the row regions into the region where no power supply wiring of the specific wiring layer is detected in such a manner that the second power supply wiring extends over the first connectable power supply wiring, and
   wherein the layout data is output.

4. A design support method to cause a computer accessible to layout data to provide a layout in which macro cells that include semiconductor circuit elements are arranged and in which power supply wirings are formed at certain intervals in each wiring layer to execute, the design support method comprising:
   specifying, by the computer, a wiring layer to be connected to each of the macro cells included in the layout represented by the layout data;
   extracting a macro cell from among the macro cells included in the layout represented by the layout data, the macro cell being a macro cell where no power supply wiring of a wiring layer specified in the specifying to be connected to the macro cell is formed in a projection area located above the macro cell;
   detecting a set of power supply wirings between which the extracted macro cell is located from among power supply wirings of the wiring layer specified to be connected to the macro cell; and
   outputting a detection result obtained in the detecting.

5. The design support method according to claim 4, comprising:
   inserting a power supply wiring connectable to the extracted macro cell into a projection area located above the extracted macro cell; and
   connecting the power supply wiring inserted in the inserting to a power supply wiring of a specific wiring layer by extending the inserted power supply wiring, and wherein layout data is output, the layout data being providing a layout in which the power supply wiring connectable to the extracted macro cell has been connected in the connecting.

6. The design support method according to claim 5, comprising:

determining whether or not the power supply wiring connectable to the extracted macro cell overlaps another macro cell when the power supply wiring is extended, wherein when it is determined in the determining that the power supply wiring connectable to the extracted macro cell overlaps another macro cell, the inserting further inserts a second power supply wiring connectable to the power supply wiring connectable to the extracted macro cell into the region where no power supply wiring of the specific wiring layer is detected in such a manner that the second power supply wiring extends over the first connectable power supply wiring, and wherein the layout data is output.

* * * * *